United States Patent
Ogami et al.

(10) Patent No.: US 7,799,438 B2
(45) Date of Patent: Sep. 21, 2010

(54) SURFACE-COATED CUTTING TOOL AND METHOD FOR PRODUCING SAME

(75) Inventors: Tsuyoshi Ogami, Shimatsuma (JP); Yusuke Tanaka, Akashi (JP)

(73) Assignee: Mitsubishi Materials Corporation, Tokyo (JP)

( * ) Notice: Subject to any disclaimer, the term of this patent is extended or adjusted under 35 U.S.C. 154(b) by 843 days.

(21) Appl. No.: 11/570,692

(22) PCT Filed: Dec. 28, 2004

(86) PCT No.: PCT/JP2005/019637

§ 371 (c)(1),
(2), (4) Date: Mar. 8, 2007

(87) PCT Pub. No.: WO2006/043704

PCT Pub. Date: Apr. 27, 2006

(65) Prior Publication Data

US 2007/0259202 A1    Nov. 8, 2007

(30) Foreign Application Priority Data

| Jun. 18, 2004 | (JP) | 2004-181248 |
| Jun. 18, 2004 | (JP) | 2004-181250 |
| Jun. 18, 2004 | (JP) | 2004-181251 |
| Nov. 30, 2004 | (JP) | 2004-345465 |
| Nov. 30, 2004 | (JP) | 2004-345471 |
| Nov. 30, 2004 | (JP) | 2004-345474 |
| Dec. 1, 2004  | (JP) | 2004-348163 |
| Dec. 1, 2004  | (JP) | 2004-348170 |
| Dec. 7, 2004  | (JP) | 2004-353531 |

(51) Int. Cl.
 B32B 15/00 (2006.01)
 B23C 5/16 (2006.01)
 B23P 15/28 (2006.01)

(52) U.S. Cl. .......... 428/639; 51/309; 51/307; 428/698; 428/704

(58) Field of Classification Search .............. None
See application file for complete search history.

(56) References Cited

U.S. PATENT DOCUMENTS 5,330,853 A   7/1994   Hofmann et al.
5,580,653 A   12/1996  Tanaka et al.

(Continued)

FOREIGN PATENT DOCUMENTS

GB   2378187   2/2003

(Continued)

OTHER PUBLICATIONS

Wadsworth et al. Thermal stability and oxidation resistance of TiAlN/CrN multilayer coatings, Surface & Coatings Technology, vol. 94-95, pp. 315-321, 1997.

*Primary Examiner*—Aaron Austin
(74) *Attorney, Agent, or Firm*—Leason Ellis LLP

(57) ABSTRACT

A surface-coated cutting tool comprising a cutting tool body, and a hard coating layer formed on a surface of the cutting tool body. The hard coating layer comprises an upper layer comprising chromium boride and a lower layer comprising a composite nitride containing Ti and Al. The composite nitride preferably satisfies a composition formula: $(Ti_{1-X}Al_X)N$, where X is in a range from 0.40 to 0.75 by atomic ratio.

18 Claims, 3 Drawing Sheets

U.S. PATENT DOCUMENTS

| | | |
|---|---|---|
| 6,033,768 A | 3/2000 | Muenz et al. |
| 2002/0039670 A1 | 4/2002 | Ishikawa et al. |
| 2004/0005981 A1 | 1/2004 | Weber et al. |
| 2005/0129986 A1 | 6/2005 | Sata et al. |

FOREIGN PATENT DOCUMENTS

| | | |
|---|---|---|
| JP | 01028358 A  * | 1/1989 |
| JP | 04-026756 | 1/1992 |
| JP | 05-195199 | 8/1993 |
| JP | 07-310174 A | 11/1995 |
| JP | 08-209333 | 8/1996 |
| JP | 10-330914 | 12/1998 |
| JP | 2002-028804 | 1/2002 |
| JP | 2002-146515 | 5/2002 |
| JP | 2004-11018 | 1/2004 |
| WO | 03/061884 | 7/2003 |

* cited by examiner

SURFACE-COATED CUTTING TOOL AND METHOD FOR PRODUCING SAME

CROSS REFERENCE TO PRIOR APPLICATION

This is a U.S. national phase application under 35 U.S.C. §371 of International Patent Application No. PCT/JP2004/019637, filed Dec. 28, 2004, and claims the benefit of Japanese Application Nos. 2004-181248, filed Jun. 18, 2004, 2004-181250, filed Jun. 18, 2004, 2004-181251, filed Jun. 18, 2004, 2004-345465, filed Nov. 30, 2004, 2004-345471, filed Nov. 30, 2004, 2004-345474, filed Nov. 30, 2004, 2004-348163, filed Dec. 1, 2004, 2004-348170, filed Dec. 1, 2004 and 2004-353531, filed Dec. 7, 2004, all of which are incorporated by reference herein. The International Application was published in Japanese on Dec. 29, 2005 as International Publication No. WO2005/123312 A1 under PCT Article 21(2).

TECHNICAL FIELD

The invention relates to a surface-coated cutting tool and method for producing the same which can specifically show excellent wear resistance in cases of cutting of hard difficult-to-cut materials such as Ti-based alloy, Ni-based alloy, Co-based alloy, and high-Si Al—Si system alloy or the like under a high-speed cutting condition accompanied with high-heat generation.

BACKGROUND ART

There are well-known cutting tools such as indexable inserts, drills, miniature drills, and solid type end mills. Indexable inserts are attached to an end of a cutting tool such that the inserts can be freely attached or removed and are used for turning, milling of work materials such as various types of steel and cast ion. Drills and miniature drills are used for drilling of the above-described work materials. Solid type end mills are used for face milling, slotting, and side milling of the above-described work materials. Insert type end mills are removably attached with the indexable inserts and are employed for a cutting operation the same as the solid type end mills.

As a surface-coated cutting tool, there is a well-known surface-coated cutting tool comprising a cutting tool body and a hard coating layer physically vapor-deposited on the surface of the substrate, wherein the substrate is constituted of tungsten carbide (hereafter referred to as WC)-based hard-metal or titanium carbonitride (hereafter referred to as TiCN)-based cermet, and the hard coating layer is a wear-resistant hard layer having an average thickness of 0.8 to 5 μm and comprising a layer of composite nitride containing Ti and Al (hereafter referred to as (Ti,Al)N). Since the (Ti,Al)N is provided with excellent high-temperature hardness, excellent heat resistance by the Al component, and is provided with excellent high-temperature strength by the Ti component, the above-described surface-coated cutting tool is known to exert an excellent cutting performance in a case of continuous cutting or intermittent cutting of various steels and cast irons.

Further, it is also known that the above-described surface-coated cutting tool can be produced using an arc ion plating apparatus which is a type of physical vapor-deposition apparatus schematically shown in FIG. 3. After placing the above-described cutting tool body in the apparatus, the wear-resistant hard coating layer comprising the (Ti, Al)N layer may be deposited as the hard coating layer on the surface of the cutting tool body under conditions comprising: heating the inside of the apparatus at 500° C.; in that state, by a condition of e.g., electric current: 90 A, generating arc discharge between an anode and a Ti—Al containing alloy of a predetermined composition placed as a cathode (evaporation source); simultaneously, as a reaction gas, introducing nitrogen gas into the apparatus to obtain a reaction atmosphere of e.g., 2 Pa; and applying a bias voltage of e.g., −100V to the above-described cutting tool body (For example, Japanese Unexamined Patent Application First Publication, No. H8-209333; Japanese Unexamined Patent Application First Publication, No. H7-310174; Japanese Unexamined Patent Application First Publication, No. H4-26756).

DISCLOSURE OF INVENTION

Problems to be Solved by the Invention

Recent enhancement of the performance of a cutting machine and automation of the machine are remarkable. On the other hand, there is a strong demand for power saving, energy saving, and cost reduction in the cutting operation. Along with such trends, there is a tendency of accelerating cutting speed. In addition, there is a demand for a coated cutting tool having a universal applicability that is not limited to a specific type of work materials. The above-described surface-coated cutting tools cause no problem when they are used for cutting of work materials such as various types of steel and cast iron under normal cutting conditions. However, when the above-described surface-coated cutting tools are used for cutting, under high speed conditions, of hard difficult-to-cut material such as Ti-based alloy, Ni-based alloy, Co-based alloy, or high-Si Al—Si system alloy, extremely high heat generated during the cutting remarkably enhances the progress of wear of the wear-resistant hard layer, and therefore the surface-coated cutting tools reach the ends of their tool lives in a relatively short period of time.

Expedient for Solving the Problems

Based on the above-described point of view, the inventors performed research in order to develop a surface-coated cutting tool having a wear-resistant hard layer showing excellent wear resistance specifically in high-speed cutting of the above-described hard difficult-to-cut materials. As a result of the study, it was found that the exertion of the excellent property of the above-described (Ti, Al) N layer used as the hard coating layer of the above-described conventional surface-coated cutting tool could be prolonged over a long period of time, if the (Ti, Al)N layer was formed as a lower layer and a chromium boride (hereafter referred to as $CrB_2$) layer was formed on the (Ti, Al)N layer as an upper layer, since the above-described $CrB_2$ layer had an excellent thermal stability, had very low affinity and retained low reactivity to the work material of hard difficult-to-cut material even in a heated state caused by high-heat generation during high-speed cutting of the above-described work material of hard difficult-to-cut material, thereby effectively protecting the (Ti, Al)N lower layer. Especially, it was found that, in terms of high-temperature hardness, heat resistance, and high-temperature strength, the (Ti, Al)N composing the lower layer preferably had a composition formula of $(Ti_{1-x}Al_x)N$, where X denoted 0.40 to 0.75 by atomic ratio.

The hard coating layer according to the invention can be produced by a deposition apparatus having both an arc ion plating device (hereafter referred to as AIP device) and a sputtering device (hereafter referred to as an SP device). The deposition apparatus is exemplified by a schematic plan view in FIG. 2A, and a schematic front view in FIG. 2B. A rotation table for placing a cutting tool body is provided in the center of the apparatus. On both sides of the above-described rotation table, an alloy of a predetermined composition containing Al and Ti is placed on one side as a cathode electrode of the above-described AIP device, and a sintered body of $CrB_2$ (for example, which may be a hot-pressed compact of $CrB_2$ raw powder) is placed on the opposite side as a cathode electrode (evaporation sources) of the above-described SP device. On the rotation table of the apparatus, on positions having a predetermined radial distance from the central axis of the table, a plurality of tool bodies are placed forming a ring-like arrangement along the periphery of the table. In that state, while maintaining the atmosphere inside of the apparatus as a nitrogen atmosphere, the rotation table is rotated and the cutting tool bodies themselves are revolved so as to homogenize the thickness of hard layers to be deposited. As a basic method, firstly arc discharge is generated between the anode electrode and the cathode electrode (evaporation source) of the alloy containing Ti and Al, thereby vapor-depositing the (Ti,Al)N layer on the surface of the cutting tool body so as to form a wear-resistant hard layer having an average thickness of 0.8 to 5 μm. Next, the above-described nitrogen atmosphere as the inside atmosphere of the apparatus is replaced by an atmosphere substantially composed of Ar, and sputtering of the $CrB_2$ sintered body placed as the cathode electrode (evaporation source) of the above-described SP device is started, vapor-depositing a $CrB_2$ layer with an average thickness of 0.8 to 5 μm, as a surface layer laminated on the (Ti, Al)N layer. Thus, hard coating layer according to the present invention can be produced.

It was also found that, when a delamination caused a problem, for example, in a case of an intermittent cutting operation at high cutting speed, a bonding layer having an average thickness of 0.1 to 0.5 μm could be intervened between the (Ti,Al)N lower layer and the $CrB_2$ upper layer. Because of the multiplier effect of the firm bonding of the bonding layer to the (Ti,Al)N lower layer as well as to the $CrB_2$ upper layer and the excellent bonding of the (Ti,Al)N layer to the surface of the cutting tool body, the hard coating layer having the bonding layer intervened between the (Ti,Al)N lower layer and the $CrB_2$ upper layer are not delaminated and can exert excellent wear resistance even in a case of high speed cutting of the above-described hard difficult-to-cut material, accompanied with high heat generation. It is preferable that the above-described bonding layer be a chromium nitride (hereafter referred to as CrN) layer or a composite boronitride layer containing Ti, Al, and Cr.

In a case in which a CrN layer is vapor-deposited as the bonding layer, a deposition apparatus having an AIP device and an SP device, as exemplified by a schematic plan view in FIG. 1A, and a schematic front view in FIG. 1B can be used. A chromium metal of a predetermined composition, and an alloy containing Ti and Al are placed as cathode electrodes (evaporation sources) of the above-described AIP device. On the other side, a $CrB_2$ sintered body is placed as a cathode electrode (evaporation source) of the above-described SP device. The cutting tool bodies are placed on the table. While rotating the table, and spinning the cutting tool body itself, a (Ti, Al)N layer is vapor-deposited by the above-described method. After that, while maintaining the nitrogen atmosphere for forming the (Ti, Al)N layer, arc discharge is generated between the above-described cathode electrode (evaporation source) of the metallic Cr and an anode electrode, thereby forming formation conditions of the above-described CrN layer. After that, the above-described nitrogen atmosphere as the atmosphere of the deposition apparatus is replaced by a mixed gas atmosphere of Ar and nitrogen. In that case, the mixed gas atmosphere is changed depending on time such that the proportion of introduced Ar is gradually increased as the proportion of introduced nitrogen is gradually decreased, and is finally converted to an Ar atmosphere. At the same time as the introduction of the mixed gas atmosphere into the apparatus, sputtering of the $CrB_2$ sintered body placed as the cathode (evaporation source) of the above-described SP device is started. Thus the CrN layer can be deposited.

In a case in which an adhesive bonding layer having the vapor-deposited composite boronitride layer containing Ti, Al and Cr is vapor-deposited, the hard coating layer may be produced by a deposition apparatus having the AIP device and the SP device, as exemplified by a schematic plan view in FIG. 2A, and a schematic front view in FIG. 2B. An alloy having a predetermined composition containing Ti and Al is placed as a cathode electrode (evaporation sources) of the above-described AIP device. On the other side, a $CrB_2$ sintered body is placed as a cathode electrode (evaporation source) of the above-described SP device. The cutting tools are placed on the table. While rotating the table, and spinning the cutting tool body, as a wear-resistant hard layer, a (Ti, Al)N layer is vapor-deposited in accordance with the above-described method. While continuing the arc discharge between the above-described Ti—Al containing alloy for forming the wear-resistant hard coating layer and the anode electrode, the gas introduced into the apparatus is replaced from nitrogen to a mixed gas of Ar and nitrogen, and sputtering is generated in the above-described $CrB_2$ sintered body placed as a cathode electrode (evaporation source) of the above-described SP device. Thus, the composite nitride layer containing Ti, Al and Cr can be formed.

As the wear-resistant hard layer of the invention, it is possible to form a layer of composite nitride containing Ti, Al, and Si (hereafter referred to as (Ti, Al, Si)N) or a layer of composite nitride containing Ti, Al and B (hereafter referred to as (Ti, Al, B)N) where a part of Al is substituted by Si or B, as an alternative to the (Ti, Al)N layer. Based on the view point of heat resistance and high-temperature hardness, the (Ti, Al, Si)N layer preferably has a composition formula: $(Ti_{1-X}Al_{X-Y}Si_Y)N$, where X is in a range from 0.40 to 0.75 and Y is in 0.10 or less, and the (Ti, Al, B)N layer preferably has a composition formula: $(Ti_{1-X}Al_{X-Z}B_Z)N$ (where X is in a range from 0.40 to 0.75 and Z is 0.10 or less).

For the formation of the (Ti, Al, Si)N layer or the (Ti, Al, B)N layer as an alternative to the (Ti,Al)N layer, it is possible to use a similar method as the above-described method. While, for forming the above-described lower layer, in the apparatus shown by FIGS. 1A and 1B, or FIGS. 2A and 2B, an alloy containing Ti, Al, and Si or an alloy containing Ti, Al, and B is used as the cathode electrode (evaporation source) of the AIP device, made of the alloy containing Ti and Al.

The reason for the above-described numerical limitations for the layers of the hard coating layers of the surface-coated cutting tool of the invention is explained in the following.

In the (Ti,Al)N (composition formula: $(Ti_{1-X}Al_X)N$) layer constituting the wear-resistant hard layer, the Al has an effect of improving high-temperature hardness, heat resistance, and the Ti component has an effect of improving high-temperature strength. However, where the X value that shows the proportion (hereafter, by atomic ratio) of Al to the sum of Al and Ti is less than 0.40, because of a relatively excessive proportion of Ti, it is impossible to ensure excellent high-temperature hardness and heat-resistance which are required in the high-speed cutting operation, and progress of wear is enhanced. On the other hand, where the X showing the proportion of Al exceeds 0.75, because of a relatively too low proportion of Ti, high-temperature strength is reduced, and chipping (micro chipping) or the like is easily caused at the cutting edge, and progress of wear is enhanced. Therefore, the X value is preferably in a range from 0.40 to 0.75.

Where the (Ti, Al)N layer constituting the wear-resistant hard layer has an average thickness of less than 0.8 μm, because of the insufficient thickness, the (Ti,Al)N layer cannot exert its excellent wear resistance over a long period of time. On the other hand, where the average thickness of the (Ti, Al)N layer exceeds 5 μm, the cutting edge is easily chipped in the above-described high-speed cutting of the hard difficult-to-cut material. Therefore, the (Ti,Al)N layer preferably has an average thickness of 0.8 to 5 μm.

As described above, the $CrB_2$ layer constituting the upper layer has excellent thermally stable properties and has extremely low reactivity with the work material and chip heated at high temperature. Therefore, even in the high-speed cutting of hard difficult-to-cut material, accompanied with remarkable high-heat generation, the $CrB_2$ layer protects the (Ti,Al)N layer constituting the lower layer from the above-described work material or chip heated at a high temperature, and inhibits the progress of wear of the (Ti, Al)N layer. If the average thickness of the $CrB_2$ layer is less than 0.8 μm, the above-described property cannot be exerted with a satisfactory effect. If the $CrB_2$ layer has a too large average layer thickness exceeding 5 μm, chipping occurs. Therefore, the $CrB_2$ layer preferably as an average thickness of 0.8 to 5 μm.

In a case in which a bonding layer is intervened between the (Ti,Al)N lower layer and the $CrB_2$ upper layer, where the average layer thickness of the bonding layer is less than 0.1 μm, it is impossible to ensure a firm bonding strength between the upper layer and the lower layer. On the other hand, where the average layer thickness of the bonding layer exceeds 0.5 μm, strength of the hard coating layer is reduced at the portion of the bonding layer, thereby causing chipping. Therefore the average layer thickness of the bonding layer is preferably 0.1 to 0.5 μm.

In the case in which a part of Al of the (Ti,Al)N layer is substituted by Si or B, and the (Ti, Al, Si)N layer having a composition formula: $(Ti_{1-X}Al_{X-Y}Si_Y)N$ or a (Ti, Al, B)N layer having a composition formula of $(Ti_{1-X}Al_{X-Z}B_Z)$ is used as an alternative to the (Ti,Al)N layer, by substituting a part of Al, the Si component or the B component coexist with the Al, and enhances heat resistance and high temperature hardness. However, where the Y value showing the proportion of Si or the Z value showing the proportion of B to the sum with the Ti and Al exceeds 0.10, high-temperature hardness is reduced. Therefore, the Y value and the Z value are preferably 0.10 or less.

In the surface-coated cutting tool of the invention, the lower layer as a constituent of the hard coating layer comprises the (Ti,Al)N layer, (Ti, Al, Si)N layer, or the (Ti, Al, B)N layer and exhibits excellent high temperature hardness, heat resistance, and excellent high temperature strength. In addition, the $CrB_2$ layer as the upper layer ensures excellent thermal stability against the work material, namely low reactivity with the work material. Therefore, the surface-coated cutting tool of the invention can exert an excellent wear resistance for a long period of time, even in the cutting operation of the hard difficult-to-cut material with high-speed cutting conditions accompanied with high-heat generation.

DETAILED DESCRIPTION OF THE INVENTION

Figure 1A:
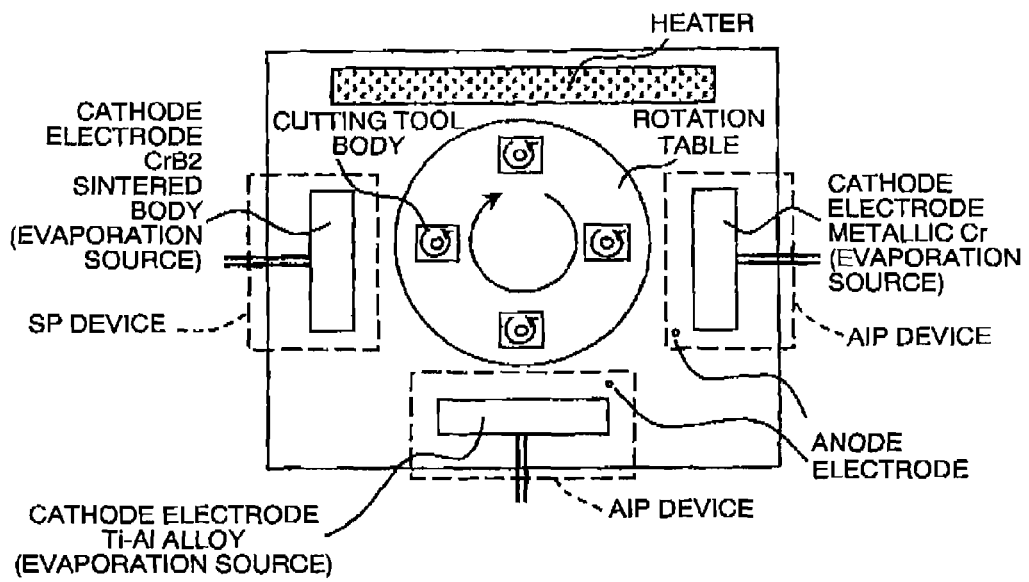
FIG. 1A is a schematic plan view used for forming the surface coating layer as a constituent of the surface-coated cutting tool according to a first embodiment of the invention.

Next a coated cutting tool of the invention is explained with reference to examples Example 1

As raw powders, WC powder, TiC powder, ZrC powder, VC powder, TaC powder, NbC powder, $Cr_3C_2$ powder, TiN powder, TaN powder, and Co powder, all of which had an average grain diameter in a range from 1 to 3 μm, were prepared and mixed in accordance with the compounding composition presented in Table 1. The raw powders were blended under wet conditions using a ball mill for 72 hours. After drying, the mixed powders were press-molded under a pressure of 100 MPa so as to form compacts. The compacts were held under vacuum conditions of 6 Pa at a temperature of 1400° C. for 1 hour so as to be sintered. After sintering the compacts, by shaping the cutting edges by honing of R:0.03 mm, cutting tool bodies A-1 to A-10 made of WC-based hardmetal having a geometrical configuration of an insert meeting ISO standard CNMG 120408 were produced.

In addition, as raw powders, TiCN powder (TiC/TiN=50/50 by mass ratio), $Mo_2C$ powder, ZrC powder, NbC powder, TaC powder, WC powder, Co powder and Ni powder, all of which had an average grain diameter ranging from 0.5 to 2 μm, were prepared. These raw powders were mixed in accordance with the compounding compositions presented in Table 2, and blended under wet conditions using a ball mill for 24 hours. After drying, the mixed powders were press-molded under a pressure of 100 MPa so as to form compacts. The compacts were held in a nitrogen atmosphere of 2 kPa at a temperature of 1500° C. for 1 hour so as to be sintered. After sintering the compacts, by shaping the cutting edges by honing of R:0.03 mm, cutting tool bodies B-1 to B-6 made of TiCN-based cermet having a geometrical configuration of an insert meeting ISO standard CNMG 120408 were produced.

In addition, as the cathode electrode (evaporation source) for forming the upper layer of the hard coating layer, a $CrB_2$ sintered body was prepared by hot pressing of $CrB_2$ powder under conditions including a temperature of 1500° C., pressure of 20 MPa, and retention time of 3 hours.

(a) Next, each of the above-described cutting tool bodies, A-1 to A-10, and B-1 to B-6 was subjected to ultrasonic cleaning in an acetone bath. After drying, the cutting tool bodies were placed on a rotation table along the circumference thereof at a predetermined radial distance from the center axis, in a deposition apparatus shown in FIGS. 1A and 1B. A metallic Cr for forming the bonding layer was placed as a cathode electrode (evaporation sources) of the AIP device on one side.

On the other side, a CrB$_2$ sintered body for forming the surface layer was placed as a cathode electrode (evaporation source) of the SP device. In addition, Ti—Al alloy having a predetermined composition was placed at a position distant from the metallic Cr and the CrB$_2$ sintered body by 90°.

(b) Firstly, while maintaining the inside of the apparatus under a vacuum condition of not more than 0.1 Pa by evacuation, the inside of the apparatus was heated to 500° C. by a heater. After that, a bias voltage of −1000V was applied to the cutting tool body rotating and spinning on the rotation table, and arc discharge was generated by applying an electric current of 100 A between the Ti—Al alloy as the cathode electrode and anode electrode, thereby performing bombardment cleaning of the surfaces of the cutting tool bodies by the Ti—Al alloy.

(c) Next, a nitrogen gas was introduced as a reaction gas into the apparatus to maintain a reaction atmosphere of 3 Pa, and a DC bias voltage of −100 V was applied to the cutting tool bodies that were spinning and rotating on the rotation table. At the same time, arc discharge was generated by applying a current of 100 A between the cathode electrode of the Ti—Al alloy and the anode electrode, thereby vapor depositing the (Ti, Al)N layer having the target composition and the target layer thickness shown in Table 3 as the lower layer of the hard coating layer on the surface of the cutting tool bodies.

(d) Then the arc discharge between the anode and the cathode electrode for forming the lower layer was stopped. While maintaining the atmosphere in the apparatus to be the same nitrogen atmosphere of 3 Pa, and applying the same DC bias voltage (−100V) to the cutting tool bodies, arc discharge was generated by applying electric current of 100 A between the cathode electrode of the metallic Cr and the anode electrode, thereby the CrN layer having the target layer thickness shown in Table 3 was vapor-deposited as the bonding layer of the hard coating layer.

(e) While continuing the above-described arc discharge between the metallic Cr and anode, the nitrogen atmosphere in the deposition apparatus was replaced by the mixed gas atmosphere of Ar and nitrogen, wherein the atmosphere was changed depending on time such that the proportion of introduced Ar was gradually increased as the proportion of introduced nitrogen was gradually decreased, and finally, the atmosphere was converted to Ar atmosphere. At that time, the pressure of the reaction atmosphere was also gradually decreased depending on time, from 3 Pa to 0.3 Pa. At the same time as the introduction of the mixed gas of Ar and nitrogen into the deposition apparatus, sputtering of the CrB$_2$ sintered body placed as the cathode (evaporation source) of the above-described SP device was started under the sputtering condition of output: 3 kW. The above-described arc discharge between the metallic Cr and the anode electrode was stopped when the proportion of nitrogen in the above-described mixed gas atmosphere of Ar and nitrogen as the reaction atmosphere was reduced to 10% by volume.

(f) After that, while maintaining the above-described Ar atmosphere of 0.3 Pa, sputtering was continued maintaining the sputtering power of 3 kW between the CrB$_2$ sintered body and the anode, and surface-coated indexable inserts of the invention (hereafter referred to as coated insert of the invention) 1-16 were respectively produced as the surface-coated cutting tools according to the invention.

In addition, with a purpose of obtaining comparative data, the above-described cutting tool bodies A-1 to A-10 and B-1 to B-6 were subjected to ultrasonic cleaning in an acetone bath. After drying, each of the cutting tool bodies was placed in a deposition apparatus shown in FIG. 3. Ti—Al alloy having a composition selected from various compositions was placed in the deposition apparatus as a cathode (evaporation source). Firstly, while maintaining the inside of the apparatus under a vacuum condition of not more than 0.1 Pa by evacuation, the inside of the apparatus was heated to 500° C. by a heater. After that, by applying a bias voltage of −1000V to the tool body, and arc discharge was generated by applying an electric current of 100 A between the Ti—Al alloy as the cathode electrode and anode electrode, thereby performing bombardment cleaning of the surfaces of the cutting tool bodies by the Ti—Al alloy. Next, a nitrogen gas was introduced as a reaction gas into the apparatus to maintain a reaction atmosphere of 3 Pa, and a DC bias voltage applied to the cutting tool bodies was lowered to −100 V, and arc discharge was generated between the cathode electrode of the Ti—Al alloy and the anode electrode, thereby vapor-depositing the (Ti, Al)N layer having the target composition and the target layer thickness shown in Table 4 on each of the above-described cutting tool bodies A-1 to A-10 and B-1 to B-6. Thus, conventional surface-coated indexable inserts (hereafter referred to as conventional coated inserts) 1-16 were respectively produced as conventional surface-coated cutting tools.

Next, the above-described various coated inserts were respectively screw-mounted with a fixture-jig on an end of a cutting tool made of a tool steel. In that state, coated cutting inserts of the invention 1-16, and conventional coated inserts 1-16 were applied to the following cutting.

Cutting tests on a high-Si Al—Si system alloy were carried out under high-speed dry continuous cutting conditions comprising:

workpiece: a round bar of an alloy of Al-18% Si by mass %;

cutting speed: 280 m/min;

depth of cut: 1.5 mm;

feed: 0.25 mm/rev; and cutting time: 10 minutes.

Cutting tests on a Ti-based alloy were carried out under high-speed dry continuous cutting conditions comprising:

workpiece: a round bar of an alloy of Ti-6% Al-4% V by mass %;

cutting speed: 85 m/min;

depth of cut: 1.5 mm;

feed: 0.3 mm/rev; and cutting time: 5 minutes.

In addition, cutting tests on a high-Si Al—Si system alloy were carried out under high-speed dry intermittent cutting conditions comprising:

workpiece: a round bar with 4 grooves formed in the longitudinal direction at equal spaces, of an Al-13% Si alloy by mass %;

cutting speed: 250 m/min;

depth of cut: 1.2 mm;

feed: 0.2 mm/rev; and cutting time: 13 minutes.

In each of the cutting tests, widths of flank wear of the cutting edges were measured.

The results of the measurements are listed in Tables 3 and 4.

TABLE 1

| Type | | Co | TiC | ZrC | VC | TaC | NbC | Cr$_3$C$_2$ | TiN | TaN | WC |
|---|---|---|---|---|---|---|---|---|---|---|---|
| CUTTING TOOL BODY (WC-BASED HARDMETAL) | A-1 | 10.5 | 8 | — | — | 8 | 1.5 | — | — | — | balance |
| | A-2 | 7 | — | — | — | — | — | — | — | — | balance |
| | A-3 | 5.7 | — | — | — | 1.5 | 0.5 | — | — | — | balance |
| | A-4 | 5.7 | — | — | — | 13 | — | 1 | — | — | balance |
| | A-5 | 8.5 | — | 0.5 | — | — | — | 0.5 | — | — | balance |
| | A-6 | 9 | — | — | — | 2.5 | 1 | — | — | — | balance |
| | A-7 | 9 | 8.5 | — | — | 8 | 3 | — | — | — | balance |
| | A-8 | 11 | 8 | — | — | 4.5 | — | — | 1.5 | — | balance |
| | A-9 | 12.5 | 2 | — | — | — | — | — | 1 | 2 | balance |
| | A-10 | 14 | — | — | 0.2 | — | — | 0.8 | — | — | balance |

TABLE 2

| Type | | Co | Ni | ZrC | TaC | NbC | Mo$_2$C | WC | TiCN |
|---|---|---|---|---|---|---|---|---|---|
| CUTTING TOOL BODY (TiCN-BASED CERMET) | B-1 | 13 | 5 | — | 10 | — | 10 | 16 | balance |
| | B-2 | 8 | 7 | — | 5 | — | 7.5 | — | balance |
| | B-3 | 5 | — | — | — | — | 6 | 10 | balance |
| | B-4 | 10 | 5 | — | 11 | 2 | — | — | balance |
| | B-5 | 9 | 4 | 1 | 8 | — | 10 | 10 | balance |
| | B-6 | 12 | 5.5 | — | 10 | — | 9.5 | 14.5 | balance |

TABLE 3

| | | | HARD COATING LAYER | | | | | | |
|---|---|---|---|---|---|---|---|---|---|
| | | | LOWER LAYER | | | BONDING LAYER TARGET THICKNESS OF CrN LAYER | UPPER LAYER TARGET THICKNESS OF CrB$_2$ LAYER | Width of flank wear (mm) | | |
| | SYMBOL OF CUTTING TOOL | | TARGET COMPOSITION (atomic ratio) | | TARGET THICKNESS | | | CUTTING CONDITION A | CUTTING CONDITION B | CUTTING CONDITION C |
| Type | BODY | Ti | Al | N | (μm) | (μm) | (μm) | | | |
| COATED INSERT OF THE INVENTION | 1 A-1 | 0.40 | 0.60 | 1.00 | 3.2 | 0.1 | 1.0 | 0.15 | 0.17 | 0.16 |
| | 2 A-2 | 0.45 | 0.55 | 1.00 | 0.8 | 0.3 | 3.0 | 0.15 | 0.18 | 0.17 |
| | 3 A-3 | 0.60 | 0.40 | 1.00 | 2.0 | 0.5 | 0.8 | 0.16 | 0.20 | 0.18 |
| | 4 A-4 | 0.50 | 0.50 | 1.00 | 4.5 | 0.1 | 2.5 | 0.09 | 0.12 | 0.08 |
| | 5 A-5 | 0.60 | 0.40 | 1.00 | 1.0 | 0.3 | 4.0 | 0.13 | 0.16 | 0.16 |
| | 6 A-6 | 0.40 | 0.60 | 1.00 | 3.0 | 0.5 | 1.0 | 0.15 | 0.19 | 0.15 |
| | 7 A-7 | 0.45 | 0.55 | 1.00 | 2.4 | 0.1 | 5.0 | 0.08 | 0.13 | 0.08 |
| | 8 A-8 | 0.35 | 0.65 | 1.00 | 2.5 | 0.3 | 3.0 | 0.13 | 0.16 | 0.12 |
| | 9 A-9 | 0.25 | 0.75 | 1.00 | 4.0 | 0.5 | 2.4 | 0.10 | 0.14 | 0.11 |
| | 10 A-10 | 0.50 | 0.50 | 1.00 | 5.0 | 0.1 | 3.5 | 0.08 | 0.12 | 0.09 |
| | 11 B-1 | 0.40 | 0.60 | 1.00 | 0.8 | 0.1 | 1.6 | 0.16 | 0.20 | 0.17 |
| | 12 B-2 | 0.50 | 0.50 | 1.00 | 3.5 | 0.3 | 5.0 | 0.07 | 0.12 | 0.10 |
| | 13 B-3 | 0.45 | 0.55 | 1.00 | 2.5 | 0.5 | 2.2 | 0.14 | 0.15 | 0.15 |
| | 14 B-4 | 0.40 | 0.60 | 1.00 | 2.2 | 0.3 | 4.0 | 0.11 | 0.13 | 0.11 |
| | 15 B-5 | 0.60 | 0.40 | 1.00 | 3.0 | 0.1 | 3.1 | 0.12 | 0.14 | 0.13 |
| | 16 B-6 | 0.25 | 0.75 | 1.00 | 5.0 | 0.1 | 0.8 | 0.14 | 0.15 | 0.12 |

TABLE 4

| Type | SYMBOL OF CUTTING TOOL BODY | HARD COATING LAYER | | | | Width of flank wear (mm) | | |
|---|---|---|---|---|---|---|---|---|
| | | TARGET COMPOSITION (atomic ratio) | | | TARGET THICKNESS | CUTTING CONDITION | CUTTING CONDITION | CUTTING CONDITION |
| | | Ti | Al | N | (μm) | A | B | C |
| CONVENTIONAL COATED INSERT | 1  A-1 | 0.40 | 0.60 | 1.00 | 4.3 | 0.29 | 0.35 | 0.34 |
| | 2  A-2 | 0.45 | 0.55 | 1.00 | 4.1 | 0.31 | 0.36 | 0.35 |
| | 3  A-3 | 0.60 | 0.40 | 1.00 | 3.3 | 0.34 | 0.38 | 0.36 |
| | 4  A-4 | 0.50 | 0.50 | 1.00 | 7.1 | 0.24 | 0.30 | 0.27 |
| | 5  A-5 | 0.60 | 0.40 | 1.00 | 5.3 | 0.27 | 0.32 | 0.30 |
| | 6  A-6 | 0.40 | 0.60 | 1.00 | 4.5 | 0.30 | 0.37 | 0.34 |
| | 7  A-7 | 0.45 | 0.55 | 1.00 | 7.5 | 0.25 | 0.29 | 0.28 |
| | 8  A-8 | 0.35 | 0.65 | 1.00 | 5.8 | 0.27 | 0.32 | 0.30 |
| | 9  A-9 | 0.25 | 0.75 | 1.00 | 6.9 | 0.26 | 0.30 | 0.29 |
| | 10  A-10 | 0.50 | 0.50 | 1.00 | 8.6 | 0.24 | 0.28 | 0.27 |
| | 11  B-1 | 0.40 | 0.60 | 1.00 | 2.5 | 0.34 | 0.38 | 0.36 |
| | 12  B-2 | 0.50 | 0.50 | 1.00 | 8.8 | 0.25 | 0.28 | 0.27 |
| | 13  B-3 | 0.45 | 0.55 | 1.00 | 5.2 | 0.31 | 0.34 | 0.32 |
| | 14  B-4 | 0.40 | 0.60 | 1.00 | 6.5 | 0.28 | 0.31 | 0.31 |
| | 15  B-5 | 0.60 | 0.40 | 1.00 | 6.2 | 0.29 | 0.33 | 0.30 |
| | 16  B-6 | 0.25 | 0.75 | 1.00 | 5.9 | 0.31 | 0.35 | 0.34 |

Example 2

As raw powders, medium to coarse grained WC powder having an average grain diameter of 5.5 μm, fine grained WC powder of average grain diameter of 0.8 μm, TaC powder of average grain diameter of 1.3 μm, NbC powder of average grain diameter of 1.2 μm, ZrC powder of average grain diameter of 1.2 μm, $Cr_3C_2$ powder of average grain diameter of 2.3 μm, VC powder of average grain diameter of 1.5 μm, (Ti,W)C (TiC/WC=50/50 in weight ratio) powder of average grain diameter of 1.0 μm, and Co powder of average grain diameter of 1.8 μm were prepared. These raw powders were mixed in accordance with the compounding compositions presented in Table 5, added to wax and blended in acetone using a ball mill for 24 hours. After being dried under vacuum conditions, the mixed powders were press-molded under a pressure of 100 MPa so as to form various compacts each of which having a predetermined form. The compacts were sintered by conditions including: a vacuum condition of 6 Pa, heating the compacts at a heating rate of 7° C./minute to a predetermined temperature within a range of 1370 to 1470° C., retaining the compacts at the predetermined temperature for 1 hour, and furnace cooling the compacts. Thus, three types of sintered round bars for forming cutting tool bodies, respectively having a diameter of 8 mm, 13 mm, or 26 mm, were formed. By grinding the three types of sintered round bars, cutting tool bodies (end mills) C-1 to C-8 made of WC-base hardmetal were produced so as to have a form of four edges square with an helical angle of 30°, and diameter×length of the cutting edge of 6 mm×13 mm, 10 mm×22 mm, or 20 mm×45 mm.

Next, these cutting tool bodies (end mills) C-1 to C-8 were subjected to ultrasonic cleaning in an acetone bath. After drying, the cutting tool bodies were placed in a deposition apparatus shown in FIGS. 1A and 1B. Under the same conditions as Example 1, a hard coating layer constituted of the lower layer comprising (Ti, Al)N layer having the target composition and the target layer thickness shown in Table 6, bonding layer comprising the CrN layer and the upper layer comprising $CrB_2$ layer respectively having the target layer thickness shown in Table 6 were vapor-deposited on the each of the cutting tool bodies. By the above-described process, surface-coated end mills of the invention (hereafter referred to as coated end mills of the invention) 1-8 were produced as surface-coated cutting tools according to the invention.

In addition, as a comparative example, the above-described cutting tool bodies (end mills) C-1 to C-8 were subjected to ultrasonic cleaning in acetone bath. After drying, the cutting tool bodies were placed in a deposition apparatus shown in FIG. 3, under the same conditions as Example 1, the hard coating layer comprising the (Ti, Al)N layer having the target composition and the target layer thickness shown in Table 6 was vapor-deposited on each of the cutting tool bodies. By the above-described process, conventional surface-coated end mills (hereafter referred to as conventional coated end mills) 1 to 8 were produced as conventional surface-coated cutting tools.

Next, the above-described coated end mills 1 to 8 of the invention, and conventional coated end mills 1 to 8 were applied to the cutting tests.

The coated end mills 1 to 3 of the invention, and comparative coated end mills 1 to 3 were applied to high-speed dry slotting of a high-Si Al—Si system alloy under conditions comprising:

workpiece: a plate of a high-Si Al—Si system alloy (by mass %, an Al-18% Si alloy) having a plate dimension of 100 mm×250 mm and a thickness of 50 mm;

cutting speed: 260 m/min;

depth of slot (depth of cut): 3 mm; and table feed: 800 mm/min.

The coated end mills 4 to 6 of the invention, and comparative coated end mills 4 to 6 were applied to high-speed dry slotting of a Ti-based alloy under conditions comprising:

workpiece: a plate of a Ti-based alloy (by mass %, a Ti-3% Al-2.5% V alloy) having a plate dimension of 100 mm×250 mm and a thickness of 50 mm;

cutting speed: 55 m/min;

depth of slot (depth of cut): 3.5 mm; and table feed: 250 mm/min.

The coated end mills 7 and 8 of the invention, and conventional coated end mills 7 and 8 were applied to high-speed dry slotting of a Ti-based alloy under conditions comprising:

workpiece: a plate of a Ti-based alloy (by mass %, a Ti-6% Al-4%V alloy) having a plate dimension of 100 mm×250 mm and a thickness of 50 mm;
cutting speed: 50 m/min;
depth of slot (depth of cut): 5 mm; and
table feed: 160 mm/min, In each slotting test, the length of the cut slot by the end mill until the end of its tool life was measured, where the end mill was regarded to reach the end of its tool life when a width of flank wear of a peripheral edge of a cutting edge of the end mill reached 0.1 mm. The results are listed in Table 6.

cutting tool bodies (drills) D-1 to D-8 were produced by grinding the round bars. Each of the cutting tool bodies had a two-edge form with a helical angle of 30°, and a diameter× length of a flute forming portion of 4 mm×13 mm (cutting tool bodies D-1 to D-3), 8 mm×22 mm (cutting tool bodies D-4 to D-6), or 16 mm×45 mm (cutting tool bodies D-7 and D-8).

Next, cutting edges of the cutting tool bodies (drills) D-1 to D-8 were subjected to honing. The cutting tool bodies were subjected to ultrasonic cleaning in an acetone bath. After drying, the cutting tool bodies were placed in the deposition apparatus shown in FIGS. 1A and 1B. Under the same con-

TABLE 5

| Type | | Co | (Ti,W)C | TaC | NbC | ZrC | $Cr_3C_2$ | VC | WC | Diameter × length of cutting edge |
|---|---|---|---|---|---|---|---|---|---|---|
| COATED TOOL BODY (END MILL) | C-1 | 5 | 5 | — | — | — | — | — | medium-coarse grain: balance | 6 × 13 |
| | C-2 | 6 | — | 1 | 0.5 | — | — | — | fine grain: balance | 6 × 13 |
| | C-3 | 6 | — | 1 | — | 1 | 0.5 | 0.5 | fine grain: balance | 6 × 13 |
| | C-4 | 8 | — | — | — | — | 0.5 | 0.5 | fine grain: balance | 10 × 22 |
| | C-5 | 9 | 25 | 10 | 1 | — | — | — | medium-coarse grain: balance | 10 × 22 |
| | C-6 | 10 | — | — | — | — | 1 | — | fine grain: balance | 10 × 22 |
| | C-7 | 12 | 17 | 9 | 1 | — | — | — | medium-coarse grain: balance | 20 × 45 |
| | C-8 | 16 | — | 10 | 5 | 10 | — | — | medium-coarse grain: balance | 20 × 45 |

TABLE 6

| | | | HARD COATING LAYER | | | | | |
|---|---|---|---|---|---|---|---|---|
| | | SYMBOL OF CUTTING TOOL BODY | LOWER LAYER | | | BONDING LAYER TARGET THICKNESS OF CrN LAYER (μm) | UPPER LAYER TARGET THICKNESS OF $CrB_2$ LAYER (μm) | LENGTH OF CUT SLOT (m) |
| Type | | | TARGET COMPOSITION (atomic ratio) | | | | | |
| | | | Ti | Al | N | TARGET THICKNESS (μm) | | |
| COATED END MILL OF THE INVENTION | 1 | C-1 | 0.50 | 0.50 | 1.00 | 2.0 | 0.1 | 3.3 | 155 |
| | 2 | C-2 | 0.40 | 0.60 | 1.00 | 1.6 | 0.3 | 0.8 | 110 |
| | 3 | C-3 | 0.25 | 0.75 | 1.00 | 0.8 | 0.2 | 2.2 | 120 |
| | 4 | C-4 | 0.40 | 0.60 | 1.00 | 5.0 | 0.3 | 1.8 | 56 |
| | 5 | C-5 | 0.50 | 0.50 | 1.00 | 2.2 | 0.1 | 3.6 | 50 |
| | 6 | C-6 | 0.45 | 0.55 | 1.00 | 1.0 | 0.5 | 2.0 | 48 |
| | 7 | C-7 | 0.35 | 0.65 | 1.00 | 3.5 | 0.2 | 5.0 | 52 |
| | 8 | C-8 | 0.60 | 0.40 | 1.00 | 3.0 | 0.5 | 1.5 | 45 |
| CONVENTIONAL COATED END MILL | 1 | C-1 | 0.50 | 0.50 | 1.00 | 5.4 | — | — | 85 |
| | 2 | C-2 | 0.40 | 0.60 | 1.00 | 2.7 | — | — | 65 |
| | 3 | C-3 | 0.25 | 0.75 | 1.00 | 3.2 | — | — | 70 |
| | 4 | C-4 | 0.40 | 0.60 | 1.00 | 7.1 | — | — | 26 |
| | 5 | C-5 | 0.50 | 0.50 | 1.00 | 5.9 | — | — | 23 |
| | 6 | C-6 | 0.45 | 0.55 | 1.00 | 3.5 | — | — | 18 |
| | 7 | C-7 | 0.35 | 0.65 | 1.00 | 8.7 | — | — | 20 |
| | 8 | C-8 | 0.60 | 0.40 | 1.00 | 5.0 | — | — | 15 |

Example 3

Using the three types of round bar sintered body which were produced in the above-described Example 2 and respectively had a diameter of 8 mm (for forming cutting tool bodies C-1 to C-3), 13 mm (for forming cutting tool bodies C-4 to C-6), or 26 mm (for forming cutting tool bodies C-7 and C-8), ditions as the above-described Example 1, a hard coating layer constituted of the lower layer comprising (Ti, Al)N layer having the target composition and the target layer thickness shown in Table 7, and bonding layer comprising the CrN layer and the upper layer comprising $CrB_2$ layer respectively having the target layer thickness shown in Table 7 were vapor-deposited on the each of the cutting tool bodies. By the above-described process, surface-coated drills 1-8 of the invention were produced as surface-coated cutting tools of the invention.

In addition, as a comparative example, the above-described cutting tool bodies (drills) D-1 to D-8 were subjected to honing, and were subjected to ultrasonic cleaning in an acetone bath. After drying, the cutting tool bodies were placed in a deposition apparatus shown in FIG. 3, under the same conditions as Example 1, and the hard coating layer comprising (Ti, Al)N layer having the target composition and the target layer thickness shown in Table 7 was vapor-deposited on the surface of the cutting tool bodies. By the above-described process, conventional surface-coated drills (hereafter referred to as conventional coated drills 1 to 8), were produced as conventional surface-coated cutting tools.

Next, the above-described coated drills 1 to 8 of the invention, and conventional coated drills 1 to 8 were applied to the drilling tests.

The coated drills 1 to 3 of the invention, and conventional coated drills 1 to 3 were applied to high-speed wet drilling tests of high-Si Al—Si system alloy under conditions comprising:

workpiece: a plate of high-Si Al—Si system alloy (by mass %, an Al-18% Si alloy) having a plate dimension of 100 mm×250 mm and a thickness of 50 mm;
cutting speed: 85 m/min;
feed: 0.2 mm/rev; and
depth of a hole: 10 mm.

The coated drills 4 to 6 of the invention, and conventional coated drills 4 to 6 were applied to high-speed wet drilling tests of a Ti-based alloy under conditions comprising:

workpiece: a plate of Ti-based alloy (by mass %, an Ti-3% Al-2.5% V alloy) having a plate dimension of 100 mm×250 mm and a thickness of 50 mm;
cutting speed: 50 m/min;
feed: 0.2 mm/rev; and
depth of a hole: 15 mm.

The coated drills 7 and 8 of the invention, and conventional coated drills 7 and 8 were applied to high-speed wet drilling tests of a Ti-based alloy under conditions comprising:

workpiece: a plate of Ti-based alloy (by mass %, a Ti-6% Al-4% V alloy) having a plate dimension of 100 mm×250 mm and a thickness of 50 mm;
cutting speed: 55 m/min;
feed: 0.3 mm/rev; and
depth of a hole: 28 mm.

In each test of the high-speed wet drilling (using a water-soluble cutting fluid), the numbers of holes drilled until the time when the width of flank wear of the cutting edge of the end of the drill reached 0.3 mm were counted. The results are listed in Table 7.

TABLE 7

| Type | | SYMBOL OF CUTTING TOOL BODY | LOWER LAYER TARGET COMPOSITION (atomic ratio) | | | TARGET THICKNESS (μm) | BONDING LAYER TARGET THICKNESS OF CrN LAYER (μm) | UPPER LAYER TARGET THICKNESS OF CrB$_2$ LAYER (μm) | NUMBER OF DRILLING (holes) |
|---|---|---|---|---|---|---|---|---|---|
| | | | Ti | Al | N | | | | |
| COATED DRILL OF THE INVENTION | 1 | D-1 | 0.60 | 0.40 | 1.00 | 0.8 | 0.3 | 2.1 | 85 |
| | 2 | D-2 | 0.40 | 0.60 | 1.00 | 4.0 | 0.1 | 0.8 | 92 |
| | 3 | D-3 | 0.45 | 0.55 | 1.00 | 2.8 | 0.5 | 3.3 | 95 |
| | 4 | D-4 | 0.25 | 0.75 | 1.00 | 1.6 | 0.3 | 2.7 | 73 |
| | 5 | D-5 | 0.40 | 0.60 | 1.00 | 3.0 | 0.2 | 4.2 | 80 |
| | 6 | D-6 | 0.45 | 0.55 | 1.00 | 1.0 | 0.5 | 2.5 | 75 |
| | 7 | D-7 | 0.35 | 0.65 | 1.00 | 3.5 | 0.1 | 5.0 | 70 |
| | 8 | D-8 | 0.50 | 0.50 | 1.00 | 5.0 | 0.3 | 1.3 | 65 |
| CONVENTIONAL COATED DRILL | 1 | D-1 | 0.60 | 0.40 | 1.00 | 3.2 | — | — | 42 |
| | 2 | D-2 | 0.40 | 0.60 | 1.00 | 4.9 | — | — | 44 |
| | 3 | D-3 | 0.45 | 0.55 | 1.00 | 6.6 | — | — | 50 |
| | 4 | D-4 | 0.25 | 0.75 | 1.00 | 4.6 | — | — | 34 |
| | 5 | D-5 | 0.40 | 0.60 | 1.00 | 7.4 | — | — | 38 |
| | 6 | D-6 | 0.45 | 0.55 | 1.00 | 4.0 | — | — | 30 |
| | 7 | D-7 | 0.35 | 0.65 | 1.00 | 8.6 | — | — | 35 |
| | 8 | D-8 | 0.50 | 0.50 | 1.00 | 6.6 | — | — | 28 |

Example 4

Figure 1B:
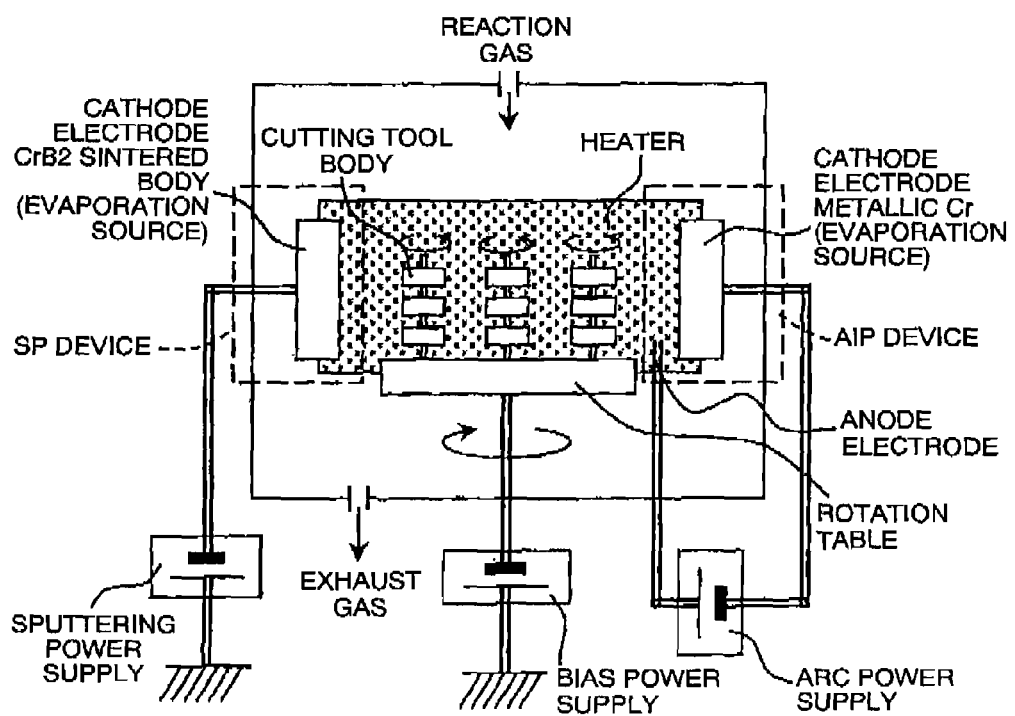
FIG. 1B is a schematic front view of a deposition apparatus shown in FIG. 1A.

The cutting tool bodies (inserts) used in Example 1 were placed in the vapor-deposition apparatus shown in FIGS. 1A and 1B, and coated inserts 1-16 of the invention were produced by vapor-depositing the hard coating layer having the target composition and the target thickness shown in Table 8. In the above-described vapor deposition, as the cathode electrode (evaporation source) for forming the lower layer, Ti—Al—Si having a predetermined composition was used as an alternative to the Ti—Al alloy. The other vapor-deposition conditions were similar to those described in Example 1.

Figure 3:
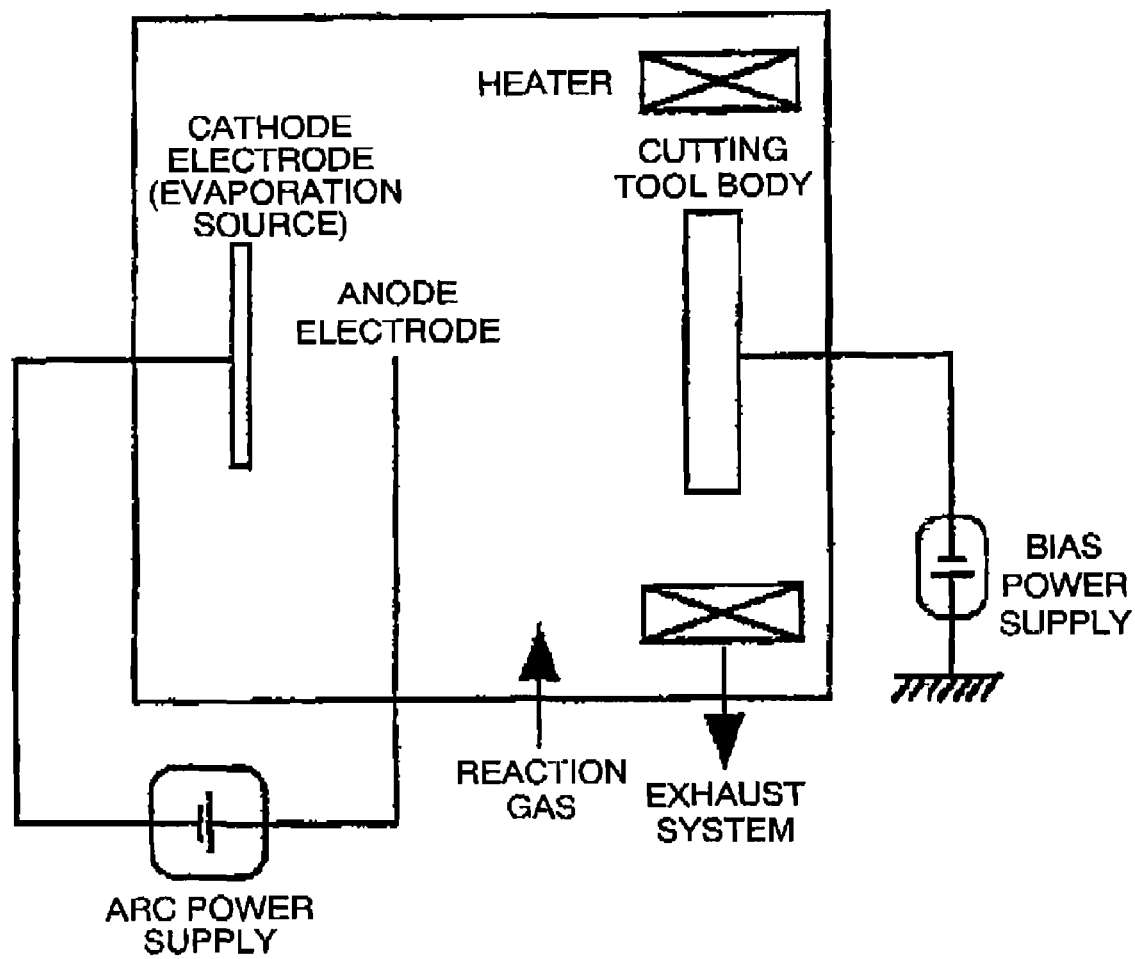
FIG. 3 is a schematic explanatory view showing another example of a common arc ion plating apparatus.

As a comparative example, the above-described cutting tool bodies (inserts) were placed in the deposition apparatus shown in FIG. 3. Conventional coated inserts 1-16 were produced by vapor-depositing the hard coating layer comprising (Ti, Al, Si)N layer having the target composition and the target thickness shown in Table 9. In the above-described vapor deposition, as the cathode electrode (evaporation source) of the AIP device, Ti—Al—Si alloy having a predetermined composition was used as an alternative to the Ti—Al alloy. The other coated conditions were similar to those described in Example 1.

Next, the above-described various coated inserts were respectively screw-mounted with a fixture-jig on an end of a cutting tool made of a tool steel. In that state, coated inserts of the invention 1-16, and conventional coated inserts 1-16 were applied to the following cutting tests.

Cutting tests on a Ti-based alloy were carried out under high-speed dry continuous cutting conditions (condition A) comprising:

workpiece: a round bar of Ti-based alloy having a composition of Ti-6% Al-4% V by mass %;

cutting speed: 110 m/min;

depth of cut: 1.5 mm;

feed: 0.2 mm/rev; and cutting time: 5 minutes.

Cutting tests on a Ni-based alloy were carried out under high-speed dry continuous cutting conditions (cutting condition B) comprising:

workpiece: a round bar of Ni-based alloy having a composition of Ni-19% Cr-18.5% Fe-5.2% Cd-5% Ta-3% Mo-0.9% Ti-0.5% Al-0.3% Si-0.2% Mn-0.05% Cu-0.04% C by mass %;

cutting speed: 80 m/min;

depth of cut: 1.0 mm;

feed: 0.15 mm/rev; and cutting time: 6 minutes.

In addition, cutting tests on a Co-based alloy were carried out under high-speed dry intermittent cutting conditions (condition C) comprising:

workpiece: a round bar of Co-based alloy with 4 grooves formed in the longitudinal direction at equal spaces, having a composition of Co-23% Cr-6% Mo-2% Ni-1% Fe-0.6% Si-0.4% C by mass %;

cutting speed: 60 m/min;

depth of cut: 0.5 mm;

feed: 0.1 mm/rev; and cutting time: 4 minutes.

In each of the cutting tests, widths of flank wear of the cutting edges were measured. The results are listed in Tables 8 and 9.

TABLE 8

| Type | SYMBOL OF CUTTING TOOL BODY | | HARD COATING LAYER | | | | | | Width of flank wear (mm) | | |
|---|---|---|---|---|---|---|---|---|---|---|---|
| | | | LOWER LAYER | | | | BONDING LAYER TARGET THICKNESS OF CrN LAYER (μm) | UPPER LAYER TARGET THICKNESS OF CrB$_2$ LAYER (μm) | CUTTING CONDITION A | CUTTING CONDITION B | CUTTING CONDITION C |
| | | | TARGET COMPOSITION (atomic ratio) | | | | TARGET THICKNESS (μm) | | | | |
| | | | Ti | Al | Si | N | | | | | |
| COATED INSERT OF THE INVENTION | 1 | A-1 | 0.49 | 0.50 | 0.01 | 1.00 | 2.4 | 0.5 | 3.0 | 0.19 | 0.20 | 0.13 |
| | 2 | A-2 | 0.55 | 0.40 | 0.05 | 1.00 | 3.3 | 0.3 | 1.6 | 0.12 | 0.18 | 0.17 |
| | 3 | A-3 | 0.45 | 0.45 | 0.10 | 1.00 | 0.8 | 0.2 | 4.0 | 0.10 | 0.12 | 0.14 |
| | 4 | A-4 | 0.49 | 0.50 | 0.01 | 1.00 | 0.9 | 0.4 | 5.0 | 0.18 | 0.14 | 0.16 |
| | 5 | A-5 | 0.40 | 0.55 | 0.05 | 1.00 | 1.0 | 0.2 | 4.5 | 0.15 | 0.16 | 0.19 |
| | 6 | A-6 | 0.30 | 0.60 | 0.10 | 1.00 | 2.1 | 0.3 | 3.2 | 0.11 | 0.09 | 0.12 |
| | 7 | A-7 | 0.59 | 0.40 | 0.01 | 1.00 | 5.0 | 0.2 | 1.4 | 0.16 | 0.15 | 0.17 |
| | 8 | A-8 | 0.60 | 0.35 | 0.05 | 1.00 | 2.5 | 0.1 | 2.4 | 0.15 | 0.16 | 0.14 |
| | 9 | A-9 | 0.55 | 0.35 | 0.10 | 1.00 | 4.2 | 0.2 | 0.8 | 0.14 | 0.10 | 0.16 |
| | 10 | A-10 | 0.34 | 0.65 | 0.01 | 1.00 | 3.0 | 0.5 | 1.8 | 0.21 | 0.19 | 0.18 |
| | 11 | B-1 | 0.35 | 0.60 | 0.05 | 1.00 | 3.8 | 0.5 | 2.0 | 0.10 | 0.13 | 0.15 |
| | 12 | B-2 | 0.40 | 0.50 | 0.10 | 1.00 | 0.8 | 0.4 | 4.2 | 0.18 | 0.17 | 0.20 |
| | 13 | B-3 | 0.59 | 0.40 | 0.01 | 1.00 | 2.2 | 0.3 | 3.0 | 0.12 | 0.10 | 0.15 |
| | 14 | B-4 | 0.60 | 0.35 | 0.05 | 1.00 | 2.4 | 0.1 | 5.0 | 0.13 | 0.11 | 0.17 |
| | 15 | B-5 | 0.25 | 0.65 | 0.10 | 1.00 | 1.3 | 0.4 | 0.8 | 0.21 | 0.14 | 0.20 |
| | 16 | B-6 | 0.34 | 0.65 | 0.01 | 1.00 | 5.0 | 0.2 | 1.4 | 0.16 | 0.10 | 0.14 |

TABLE 9

| Type | SYMBOL OF CUTTING TOOL BODY | | HARD COATING LAYER | | | | | Width of flank wear (mm) | | |
|---|---|---|---|---|---|---|---|---|---|---|
| | | | TARGET COMPOSITION (atomic ratio) | | | | TARGET THICKNESS | CUTTING CONDITION | CUTTING CONDITION | CUTTING CONDITION |
| | | | Ti | Al | Si | N | (μm) | A | B | C |
| CONVENTIONAL COATED INSERT | 1 | A-1 | 0.49 | 0.50 | 0.01 | 1.00 | 5.9 | 0.34 | 0.32 | 0.35 |
| | 2 | A-2 | 0.55 | 0.40 | 0.05 | 1.00 | 5.2 | 0.32 | 0.40 | 0.32 |
| | 3 | A-3 | 0.45 | 0.45 | 0.10 | 1.00 | 5.0 | 0.29 | 0.30 | 0.38 |
| | 4 | A-4 | 0.49 | 0.50 | 0.01 | 1.00 | 6.3 | 0.37 | 0.33 | 0.31 |
| | 5 | A-5 | 0.40 | 0.55 | 0.05 | 1.00 | 5.7 | 0.36 | 0.39 | 0.35 |
| | 6 | A-6 | 0.30 | 0.60 | 0.10 | 1.00 | 5.6 | 0.30 | 0.26 | 0.30 |
| | 7 | A-7 | 0.59 | 0.40 | 0.01 | 1.00 | 6.6 | 0.33 | 0.36 | 0.34 |
| | 8 | A-8 | 0.60 | 0.35 | 0.05 | 1.00 | 5.0 | 0.39 | 0.40 | 0.37 |
| | 9 | A-9 | 0.55 | 0.35 | 0.10 | 1.00 | 5.2 | 0.35 | 0.29 | 0.32 |
| | 10 | A-10 | 0.34 | 0.65 | 0.01 | 1.00 | 5.3 | 0.42 | 0.36 | 0.35 |
| | 11 | B-1 | 0.35 | 0.60 | 0.05 | 1.00 | 6.3 | 0.29 | 0.32 | 0.37 |
| | 12 | B-2 | 0.40 | 0.50 | 0.10 | 1.00 | 5.4 | 0.40 | 0.38 | 0.42 |
| | 13 | B-3 | 0.59 | 0.40 | 0.01 | 1.00 | 5.5 | 0.33 | 0.31 | 0.34 |
| | 14 | B-4 | 0.60 | 0.35 | 0.05 | 1.00 | 7.5 | 0.32 | 0.28 | 0.39 |
| | 15 | B-5 | 0.25 | 0.65 | 0.10 | 1.00 | 2.5 | 0.40 | 0.38 | 0.42 |
| | 16 | B-6 | 0.34 | 0.65 | 0.01 | 1.00 | 6.6 | 0.31 | 0.29 | 0.30 |

Example 5

The cutting tool bodies (end mills) used in Example 2 were placed in the vapor-deposition apparatus shown in FIGS. 1A and 1B. Using the same conditions as the above-described Example 4, coated end mills 1-8 of the invention were produced by vapor-depositing the hard coating layer having the target composition and the target thickness shown in Table 10.

As a comparative example, the above-described cutting tool bodies (end mills) were placed in the deposition apparatus shown in FIG. 3. Using the same conditions as the above-described Example 4, conventional coated end mills 1-8 were produced by vapor-depositing the hard coating layer comprising (Ti, Al, Si)N layer having the target composition and the target thickness shown in Table 10.

Next, the above-described coated end mills 1 to 8 of the invention, and conventional coated end mills 1 to 8 were applied to the cutting tests.

The coated end mills 1 to 3 of the invention, and comparative coated end mills 1 to 3 were applied to high-speed dry slotting of a Ni-based alloy under conditions comprising:

workpiece: a plate of a Ni-based alloy having a plate dimension of 100 mm×250 mm and a thickness of 50 mm, and having a composition of Ni-19% Cr-14% Co-4.5% Mo-2.5% Ti-2% Fe-1.2% Al-0.7% Mn-0.4% Si by mass %;

cutting speed: 55 m/min;

depth of slot (depth of cut): 1.2 mm; and table feed: 410 mm/min.

The coated end mills 4 to 6 of the invention, and comparative coated end mills 4 to 6 were applied to high-speed dry slotting of a Ti-based alloy under conditions comprising:

workpiece: a plate of a Ti-based alloy having a plate dimension of 100 mm×250 mm and a thickness of 50 mm, and having a composition of Ti-3% Al-2.5% V by mass %;

cutting speed: 100 m/min;

depth of slot (depth of cut): 3.0 mm; and table feed: 500 mm/min.

The coated end mills 7 and 8 of the invention, and comparative coated end mills 7 and 8 were applied to high-speed dry slotting of a Co-based alloy under conditions comprising:

workpiece: a plate of a Co-based alloy having a plate dimension of 100 mm×250 mm and a thickness of 50 mm, and having a composition of Co-20% Cr-15% W-10% Ni-1.5% Mn-1% Si-1% Fe-0.12% C by mass %;

cutting speed: 50 m/min;

depth of slot (depth of cut): 4.0 mm; and table feed: 150 mm/min.

In each slotting test, the length of the cut slot by the end mill until the end of its tool life was measured, where the end mill was regarded to reach the end of its tool life when a width of flank wear of a peripheral edge of a cutting edge of the end mill reached 0.1 mm. The results are respectively listed in Table 10.

TABLE 10

| Type | Symbol of Cutting Tool | BODY | LOWER LAYER TARGET COMPOSITION (atomic ratio) Ti | Al | Si | N | LOWER LAYER TARGET THICKNESS (μm) | BONDING LAYER TARGET THICKNESS OF CrN LAYER (μm) | UPPER LAYER TARGET THICKNESS OF CrB$_2$ LAYER (μm) | LENGTH OF CUT SLOT (m) |
|---|---|---|---|---|---|---|---|---|---|---|
| COATED END MILL OF THE INVENTION | 1 | C-1 | 0.25 | 0.70 | 0.05 | 1.00 | 3.0 | 0.4 | 1.5 | 33 |
| | 2 | C-2 | 0.45 | 0.45 | 0.10 | 1.00 | 2.4 | 0.1 | 2.3 | 45 |
| | 3 | C-3 | 0.39 | 0.60 | 0.01 | 1.00 | 5.0 | 0.2 | 2.0 | 40 |
| | 4 | C-4 | 0.35 | 0.55 | 0.10 | 1.00 | 2.3 | 0.3 | 1.4 | 42 |
| | 5 | C-5 | 0.34 | 0.65 | 0.01 | 1.00 | 1.5 | 0.3 | 3.6 | 35 |
| | 6 | C-6 | 0.55 | 0.40 | 0.05 | 1.00 | 1.8 | 0.1 | 4.5 | 50 |
| | 7 | C-7 | 0.60 | 0.35 | 0.05 | 1.00 | 4.2 | 0.5 | 0.8 | 45 |
| | 8 | C-8 | 0.40 | 0.50 | 0.10 | 1.00 | 0.8 | 0.3 | 5.0 | 55 |
| CONVENTIONAL COATED END MILL | 1 | C-1 | 0.25 | 0.70 | 0.05 | 1.00 | 4.9 | — | — | 9 |
| | 2 | C-2 | 0.45 | 0.45 | 0.10 | 1.00 | 4.8 | — | — | 13 |
| | 3 | C-3 | 0.39 | 0.60 | 0.01 | 1.00 | 7.2 | — | — | 10 |
| | 4 | C-4 | 0.35 | 0.55 | 0.10 | 1.00 | 4.0 | — | — | 12 |
| | 5 | C-5 | 0.34 | 0.65 | 0.01 | 1.00 | 5.4 | — | — | 15 |
| | 6 | C-6 | 0.55 | 0.40 | 0.05 | 1.00 | 6.4 | — | — | 9 |
| | 7 | C-7 | 0.60 | 0.35 | 0.05 | 1.00 | 5.5 | — | — | 20 |
| | 8 | C-8 | 0.40 | 0.50 | 0.10 | 1.00 | 6.1 | — | — | 18 |

Example 6

The cutting tool bodies (drills) used in Example 3 were placed in the vapor-deposition apparatus shown in FIGS. 1A and 1B. Using the same conditions as the above-described Example 4, coated drills 1-8 of the invention were produced by vapor-depositing the hard coating layer having the target composition and the target thickness shown in Table 11.

As a comparative example, the above-described cutting tool bodies (drills) were placed in the deposition apparatus shown in FIG. 3. Using the same conditions as the above-described Example 4, conventional coated end mills 1-8 were produced by vapor-depositing the hard coating layer comprising (Ti, Al, Si)N layer having the target composition and the target thickness shown in Table 11.

Next, the above-described coated drills 1 to 8 of the invention, and conventional coated drills 1 to 8 were applied to the drilling tests.

The coated drills 1 to 3 of the invention, and conventional coated drills 1 to 3 were applied to high-speed wet drilling tests of Co-based alloy under conditions comprising:

workpiece: a plate of a Co-based alloy having a plate dimension of 100 mm×250 mm and a thickness of 50 mm, and having a composition of Co-20% Cr-20% Ni-4% Mo-4% W-4% Cd-3% Fe-1.5% Mn-0.7% Si-0.38% C by mass;

cutting speed: 40 m/min;

feed: 0.08 mm/rev; and depth of a hole: 8 mm.

The coated drills 4 to 6 of the invention, and conventional coated drills 4 to 6 were applied to high-speed wet drilling tests of a Ni-based alloy under conditions comprising:

workpiece: a plate of a Ni-based alloy having a plate dimension of 100 mm×250 mm and a thickness of 50 mm, and having a composition containing Ni-19% Cr-18.5% Fe-5.2% Cd-5% Ta-3% Mo-0.9% Ti-0.5% Al-0.3% Si-0.2% Mn-0.05% Cu-0.04% C by mass;

cutting speed: 50 m/min;

feed: 0.1 mm/rev; and depth of a hole: 15 mm.

The coated drills 7 and 8 of the invention, and conventional coated drills 7 and 8 were applied to high-speed wet drilling tests of a Ti-based alloy under conditions comprising:

workpiece: a plate of a Ti-based alloy having a plate dimension of 100 mm×250 mm and a thickness of 50 mm, and having a composition of Ti-3% Al-2.5% V by mass;

cutting speed: 65 m/min;

feed: 0.2 mm/rev; and depth of a hole: 30 mm.

In each test of the high-speed wet drilling (using a water-soluble cutting fluid), the numbers of holes drilled until the time when the width of flank wear of the cutting edge of the end of the drill reached 0.3 mm were counted. The results are listed in Table 11.

TABLE 11

| | | SYMBOL OF CUTTING TOOL BODY | LOWER LAYER | | | | | BONDING LAYER TARGET THICKNESS OF CrN LAYER (μm) | UPPER LAYER TARGET THICKNESS OF CrB$_2$ LAYER (μm) | NUMBER OF DRILLING (holes) |
|---|---|---|---|---|---|---|---|---|---|---|
| Type | | | TARGET COMPOSITION (atomic ratio) | | | | TARGET THICKNESS (μm) | | | |
| | | | Ti | Al | Si | N | | | | |
| COATED DRILL OF THE INVENTION | 1 | D-1 | 0.59 | 0.40 | 0.01 | 1.00 | 2.5 | 0.2 | 3.8 | 80 |
| | 2 | D-2 | 0.50 | 0.45 | 0.05 | 1.00 | 1.2 | 0.1 | 5.0 | 83 |
| | 3 | D-3 | 0.35 | 0.55 | 0.10 | 1.00 | 0.8 | 0.3 | 1.1 | 90 |
| | 4 | D-4 | 0.49 | 0.50 | 0.01 | 1.00 | 4.0 | 0.2 | 0.8 | 87 |
| | 5 | D-5 | 0.35 | 0.60 | 0.05 | 1.00 | 2.4 | 0.5 | 1.8 | 110 |
| | 6 | D-6 | 0.50 | 0.40 | 0.10 | 1.00 | 5.0 | 0.4 | 0.9 | 100 |
| | 7 | D-7 | 0.30 | 0.65 | 0.05 | 1.00 | 4.6 | 0.2 | 2.7 | 95 |
| | 8 | D-8 | 0.40 | 0.50 | 0.10 | 1.00 | 2.3 | 0.3 | 3.2 | 105 |
| CONVENTIONAL COATED DRILL | 1 | D-1 | 0.59 | 0.40 | 0.01 | 1.00 | 6.5 | — | — | 28 |
| | 2 | D-2 | 0.50 | 0.45 | 0.05 | 1.00 | 6.3 | — | — | 26 |
| | 3 | D-3 | 0.35 | 0.55 | 0.10 | 1.00 | 2.2 | — | — | 42 |
| | 4 | D-4 | 0.49 | 0.50 | 0.01 | 1.00 | 5.0 | — | — | 36 |
| | 5 | D-5 | 0.35 | 0.60 | 0.05 | 1.00 | 4.7 | — | — | 35 |
| | 6 | D-6 | 0.50 | 0.40 | 0.10 | 1.00 | 6.3 | — | — | 50 |
| | 7 | D-7 | 0.30 | 0.65 | 0.05 | 1.00 | 7.5 | — | — | 45 |
| | 8 | D-8 | 0.40 | 0.50 | 0.10 | 1.00 | 5.8 | — | — | 38 |

Example 7

The cutting tool bodies (inserts) used in Example 1 were placed in the vapor-deposition apparatus shown in FIGS. 1A and 1B, coated inserts 1-16 of the invention were produced by vapor-depositing the hard coating layer having the target composition and the target thickness shown in Table 12. In the above-described vapor deposition, as the cathode electrode (evaporation source) for forming the lower layer, Ti—Al—B alloy having a predetermined composition was used as an alternative to the Ti—Al alloy. The other vapor-deposition conditions were similar to those described in Example 1.

As a comparative example, the above-described cutting tool bodies (inserts) were placed in the deposition apparatus shown in FIG. 3. Conventional coated inserts 1-16 were produced by vapor-depositing the hard coating layer comprising (Ti, Al, B)N layer having the target composition and the target thickness shown in Table 13. In the above-described vapor deposition, as the cathode electrode (evaporation source) of the AIP device, Ti—Al—B alloy having a predetermined composition was used as an alternative to the Ti—Al alloy. The other coated conditions were similar to those described in Example 1.

Next, the above-described various coated inserts were respectively screw-mounted with a fixture-jig on an end of a cutting tool made of a tool steel. In that state, coated inserts of the invention 1-16, and conventional coated inserts 1-16 were applied to the following cutting tests.

Cutting tests on a Ti-based alloy were carried out under high-speed, dry cutting conditions (cutting condition A) comprising:

workpiece: a round bar of Ti-based alloy having a composition of Ti-6% Al-4% V by mass %;

cutting speed: 120 m/min;

depth of cut: 1.2 mm;

feed: 0.15 mm/rev; and cutting time: 3 minutes.

Cutting tests on a Ni-based alloy were carried out under high-speed, dry, continuous cutting conditions (cutting condition B) comprising:

workpiece: a round bar of Ni-based alloy having a composition of Ni-19% Cr-14% Co-4.5% Mo-2.5% Ti-2% Fe-1.2% Al-0.7% Mn-0.4% Si by mass;

cutting speed: 80 m/min;

depth of cut: 0.3 mm;

feed: 0.2 mm/rev; and cutting time: 8 minutes.

In addition, cutting tests on a Co-based alloy were carried out under high-speed dry intermittent cutting conditions (condition C) comprising:

workpiece: a round bar of Co-based alloy with 4 grooves formed in the longitudinal direction at equal spaces, having a composition of Co-23% Cr-6% Mo-2% Ni-1% Fe-0.6% Si-0.4% C by mass %;

cutting speed: 60 m/min;

depth of cut: 0.5 mm;

feed: 0.1 mm/rev; and cutting time: 4 minutes.

In each of the cutting tests, widths of flank wear of the cutting edges were measured. The results are listed in Tables 12 and 13.

TABLE 12

| Type | Symbol of Cutting Tool | Cutting Tool Body | Lower Layer Target Composition (atomic ratio) Ti | Al | B | N | Lower Layer Target Thickness (μm) | Bonding Layer Target Thickness of CrN Layer (μm) | Upper Layer Target Thickness of CrB$_2$ Layer (μm) | Width of flank wear (mm) Cutting Condition A | Cutting Condition B | Cutting Condition C |
|---|---|---|---|---|---|---|---|---|---|---|---|---|
| COATED INSERT OF THE INVENTION | 1 | A-1 | 0.49 | 0.50 | 0.01 | 1.00 | 5.0 | 0.2 | 1.4 | 0.11 | 0.14 | 0.15 |
| | 2 | A-2 | 0.55 | 0.40 | 0.05 | 1.00 | 3.1 | 0.5 | 2.3 | 0.18 | 0.14 | 0.16 |
| | 3 | A-3 | 0.45 | 0.45 | 0.10 | 1.00 | 1.0 | 0.4 | 5.0 | 0.13 | 0.12 | 0.15 |
| | 4 | A-4 | 0.49 | 0.50 | 0.01 | 1.00 | 0.8 | 0.2 | 4.5 | 0.15 | 0.18 | 0.13 |
| | 5 | A-5 | 0.40 | 0.55 | 0.05 | 1.00 | 3.7 | 0.5 | 2.0 | 0.12 | 0.13 | 0.15 |
| | 6 | A-6 | 0.30 | 0.60 | 0.10 | 1.00 | 1.6 | 0.3 | 3.2 | 0.16 | 0.19 | 0.22 |
| | 7 | A-7 | 0.59 | 0.40 | 0.01 | 1.00 | 3.0 | 0.4 | 0.8 | 0.19 | 0.14 | 0.18 |
| | 8 | A-8 | 0.60 | 0.35 | 0.05 | 1.00 | 4.2 | 0.1 | 1.8 | 0.12 | 0.16 | 0.12 |
| | 9 | A-9 | 0.55 | 0.35 | 0.10 | 1.00 | 2.2 | 0.3 | 3.6 | 0.11 | 0.14 | 0.15 |
| | 10 | A-10 | 0.34 | 0.65 | 0.01 | 1.00 | 3.5 | 0.5 | 1.8 | 0.15 | 0.16 | 0.14 |
| | 11 | B-1 | 0.35 | 0.60 | 0.05 | 1.00 | 2.9 | 0.1 | 0.8 | 0.21 | 0.19 | 0.20 |
| | 12 | B-2 | 0.40 | 0.50 | 0.10 | 1.00 | 0.8 | 0.2 | 4.3 | 0.16 | 0.18 | 0.17 |
| | 13 | B-3 | 0.59 | 0.40 | 0.01 | 1.00 | 2.3 | 0.5 | 3.0 | 0.14 | 0.12 | 0.13 |
| | 14 | B-4 | 0.60 | 0.35 | 0.05 | 1.00 | 1.5 | 0.4 | 2.4 | 0.19 | 0.22 | 0.21 |
| | 15 | B-5 | 0.25 | 0.65 | 0.10 | 1.00 | 3.1 | 0.3 | 5.0 | 0.16 | 0.21 | 0.17 |
| | 16 | B-6 | 0.34 | 0.65 | 0.01 | 1.00 | 5.0 | 0.1 | 1.3 | 0.10 | 0.13 | 0.12 |

TABLE 13

| Type | Symbol of Cutting Tool | Cutting Tool Body | Target Composition (atomic ratio) Ti | Al | B | N | Target Thickness (μm) | Width of flank wear (mm) Cutting Condition A | Cutting Condition B | Cutting Condition C |
|---|---|---|---|---|---|---|---|---|---|---|
| CONVENTIONAL COATED INSERT | 1 | A-1 | 0.49 | 0.50 | 0.01 | 1.00 | 6.6 | 0.27 | 0.31 | 0.33 |
| | 2 | A-2 | 0.55 | 0.40 | 0.05 | 1.00 | 5.9 | 0.36 | 0.40 | 0.38 |
| | 3 | A-3 | 0.45 | 0.45 | 0.10 | 1.00 | 6.4 | 0.31 | 0.29 | 0.41 |
| | 4 | A-4 | 0.49 | 0.50 | 0.01 | 1.00 | 5.5 | 0.37 | 0.34 | 0.31 |
| | 5 | A-5 | 0.40 | 0.55 | 0.05 | 1.00 | 6.2 | 0.30 | 0.36 | 0.29 |
| | 6 | A-6 | 0.30 | 0.60 | 0.10 | 1.00 | 5.1 | 0.33 | 0.39 | 0.37 |
| | 7 | A-7 | 0.59 | 0.40 | 0.01 | 1.00 | 4.2 | 0.38 | 0.34 | 0.36 |
| | 8 | A-8 | 0.60 | 0.35 | 0.05 | 1.00 | 6.1 | 0.31 | 0.32 | 0.29 |
| | 9 | A-9 | 0.55 | 0.35 | 0.10 | 1.00 | 6.1 | 0.29 | 0.34 | 0.37 |
| | 10 | A-10 | 0.34 | 0.65 | 0.01 | 1.00 | 5.8 | 0.35 | 0.31 | 0.33 |
| | 11 | B-1 | 0.35 | 0.60 | 0.05 | 1.00 | 3.8 | 0.42 | 0.38 | 0.36 |
| | 12 | B-2 | 0.40 | 0.50 | 0.10 | 1.00 | 5.3 | 0.41 | 0.33 | 0.40 |
| | 13 | B-3 | 0.59 | 0.40 | 0.01 | 1.00 | 5.8 | 0.34 | 0.39 | 0.35 |
| | 14 | B-4 | 0.60 | 0.35 | 0.05 | 1.00 | 4.3 | 0.40 | 0.37 | 0.42 |
| | 15 | B-5 | 0.25 | 0.65 | 0.10 | 1.00 | 8.4 | 0.37 | 0.41 | 0.35 |
| | 16 | B-6 | 0.34 | 0.65 | 0.01 | 1.00 | 6.4 | 0.32 | 0.36 | 0.39 |

Example 8

The cutting tool bodies (end mills) used in Example 2 were placed in the vapor-deposition apparatus shown in FIGS. 1A and 1B. Using the same conditions as the above-described Example 7, coated end mills 1-8 of the invention were produced by vapor-depositing the hard coating layer having the target composition and the target thickness shown in Table 14.

As a comparative example, the above-described cutting tool bodies (end mills) were placed in the deposition apparatus shown in FIG. 3. Using the same conditions as the above-described Example 7, conventional coated end mills 1-8 were produced by vapor-depositing the hard coating layer comprising (Ti, Al, B)N layer having the target composition and the target thickness shown in Table 14.

Next, the above-described coated end mills 1 to 8 of the invention, and conventional coated end mills 1 to 8 were applied to the cutting tests.

The coated end mills 1 to 3 of the invention, and comparative coated end mills 1 to 3 were applied to high-speed dry slotting of a Ni-based alloy under conditions comprising:

workpiece: a plate of a Ni-based alloy having a plate dimension of 100 mm×250 mm and a thickness of 50 mm, and having a composition of Ni-19% Cr-18.5% Fe-5.2% Cd-5% Ta-3% Mo-0.9% Ti-0.5% Al-0.3% Mn-0.05% Cu-0.04% C by mass %;

cutting speed: 50 m/min;
depth of slot (depth of cut): 1 mm; and
table feed: 350 mm/min.

The coated end mills 4 to 6 of the invention, and comparative coated end mills 4 to 6 were applied to high-speed dry slotting of a Ti-based alloy under conditions comprising:

workpiece: a plate of a Ti-based alloy having a plate dimension of 100 mm×250 mm and a thickness of 50 mm, and having a composition of Ti-3% Al-2.5% V by mass %;
cutting speed: 120 m/min;
depth of slot (depth of cut): 2 mm; and
table feed: 540 mm/min.

The coated end mills 7 and 8 of the invention, and comparative coated end mills 7 and 8 were applied to high-speed dry slotting of a Co-based alloy under conditions comprising:

workpiece: a plate of a Co-based alloy having a plate dimension of 100 mm×250 mm and a thickness of 50 mm, and having a composition of Co-20% Cr-20% Ni-4% Mo-4% W-4% Cd-3% Fe-1.5% Mn-0.7% Si-0.38% C by mass;
cutting speed: 45 m/min;
depth of slot (depth of cut): 5 mm; and
table feed: 145 mm/min.

In each slotting test, the length of the cut slot by the end mill until the end of its tool life was measured, where the end mill was regarded to reach the end of its tool life when a width of flank wear of a peripheral edge of a cutting edge of the end mill reached 0.1 mm. The results are respectively listed in Table 14.

described Example 7, conventional coated drills 1-8 were produced by vapor-depositing the hard coating layer comprising (Ti, Al, B)N layer having the target composition and the target thickness shown in Table 15.

Next, the above-described coated drills 1 to 8 of the invention, and conventional coated drills 1 to 8 were applied to the drilling tests.

The coated drills 1 to 3 of the invention, and conventional coated drills 1 to 3 were applied to high-speed wet drilling tests of Co-based alloy under conditions comprising:

workpiece: a plate of a Co-based alloy having a plate dimension of 100 mm×250 mm and a thickness of 50 mm, and having a composition of Co-20% Cr-15% W-10% Ni-1.5% Mn-1% Si-1% Fe-0.12% C by mass %;
cutting speed: 45 m/min;
feed: 0.1 mm/rev; and
depth of a hole: 6 mm.

The coated drills 4 to 6 of the invention, and conventional coated drills 4 to 6 were applied to high-speed wet drilling tests of a Ni-based alloy under conditions comprising:

workpiece: a plate of a Ni-based alloy having a plate dimension of 100 mm×250 mm and a thickness of 50 mm, and having a composition of Ni-14% Cr-14% Co-4.5% Mo-2.5% Ti-2% Fe-1.2% Al-0.7% Mn-0.4% Si by mass %;
cutting speed: 50 m/min;
feed: 0.12 mm/rev; and
depth of a hole: 14 mm.

TABLE 14

| | | | HARD COATING LAYER | | | | | | |
|---|---|---|---|---|---|---|---|---|---|
| | | SYMBOL OF CUTTING TOOL | LOWER LAYER | | | | | BONDING LAYER TARGET THICKNESS OF CrN LAYER (μm) | UPPER LAYER TARGET THICKNESS OF CrB$_2$ LAYER (μm) | LENGTH OF CUT SLOT (m) |
| Type | | BODY | TARGET COMPOSITION (atomic ratio) | | | | TARGET THICKNESS (μm) | | | |
| | | | Ti | Al | B | N | | | | |
| COATED END MILL OF THE INVENTION | 1 | C-1 | 0.25 | 0.65 | 0.10 | 1.00 | 2.0 | 0.3 | 2.2 | 35 |
| | 2 | C-2 | 0.50 | 0.45 | 0.05 | 1.00 | 5.0 | 0.2 | 1.5 | 42 |
| | 3 | C-3 | 0.39 | 0.60 | 0.01 | 1.00 | 0.8 | 0.3 | 2.3 | 39 |
| | 4 | C-4 | 0.35 | 0.55 | 0.10 | 1.00 | 3.4 | 0.5 | 0.8 | 45 |
| | 5 | C-5 | 0.60 | 0.35 | 0.05 | 1.00 | 2.0 | 0.4 | 1.5 | 40 |
| | 6 | C-6 | 0.50 | 0.40 | 0.10 | 1.00 | 2.6 | 0.2 | 1.7 | 48 |
| | 7 | C-7 | 0.55 | 0.35 | 0.10 | 1.00 | 4.3 | 0.3 | 3.2 | 42 |
| | 8 | C-8 | 0.34 | 0.65 | 0.01 | 1.00 | 1.3 | 0.1 | 5.0 | 50 |
| CONVENTIONAL COATED END MILL | 1 | C-1 | 0.25 | 0.65 | 0.10 | 1.00 | 4.5 | — | — | 10 |
| | 2 | C-2 | 0.50 | 0.45 | 0.05 | 1.00 | 6.7 | — | — | 14 |
| | 3 | C-3 | 0.39 | 0.60 | 0.01 | 1.00 | 3.4 | — | — | 12 |
| | 4 | C-4 | 0.35 | 0.55 | 0.10 | 1.00 | 4.7 | — | — | 10 |
| | 5 | C-5 | 0.60 | 0.35 | 0.05 | 1.00 | 3.9 | — | — | 9 |
| | 6 | C-6 | 0.50 | 0.40 | 0.10 | 1.00 | 4.5 | — | — | 11 |
| | 7 | C-7 | 0.55 | 0.35 | 0.10 | 1.00 | 7.8 | — | — | 18 |
| | 8 | C-8 | 0.34 | 0.65 | 0.01 | 1.00 | 6.4 | — | — | 16 |

Example 9

The cutting tool bodies (drills) used in Example 3 were placed in the vapor-deposition apparatus shown in FIGS. 1A and 1B. Using the same conditions as the above-described Example 7, coated drills 1-8 of the invention were produced by vapor-depositing the hard coating layer having the target composition and the target thickness shown in Table 15.

As a comparative example, the above-described cutting tool bodies (drills) were placed in the deposition apparatus shown in FIG. 3. Using the same conditions as the above- The coated drills 7 and 8 of the invention, and conventional coated drills 7 and 8 were applied to high-speed wet drilling tests of a Ti-based alloy under conditions comprising:

workpiece: a plate of a Ti-based alloy having a plate dimension of 100 mm×250 mm and a thickness of 50 mm, and having a composition of Ti-3% Al-2.5% V by mass %;
cutting speed: 70 m/min;
feed: 0.2 mm/rev; and
depth of slot (depth of cut): 0.2 mm
table feed: 28 mm/minutes.

In each test of the high-speed wet drilling (using a water-soluble cutting fluid), the numbers of holes drilled until the time when the width of flank wear of the cutting edge of the end of the drill reached 0.3 mm were counted. The results are listed in Table 15.

(d) Next, a bonding layer was formed in order to improve the above-described vapor-deposited (Ti,Al)N layer as the wear-resistant hard layer and the $CrB_2$ layer as the surface layer formed in the subsequent vapor deposition. The arc discharge between the anode and the cathode electrode for forming the

TABLE 15

| | | | HARD COATING LAYER | | | | | |
|---|---|---|---|---|---|---|---|---|
| | SYMBOL | | LOWER LAYER | | | | BONDING LAYER TARGET THICKNESS | UPPER LAYER TARGET THICKNESS |
| Type | OF CUTTING TOOL BODY | | TARGET COMPOSITION (atomic ratio) | | | TARGET THICKNESS | OF CrN LAYER | OF $CrB_2$ LAYER | NUMBER OF DRILLING |
| | | | Ti | Al | B | N | (μm) | (μm) | (μm) | (holes) |
| COATED DRILL OF THE INVENTION | 1 | D-1 | 0.59 | 0.40 | 0.01 | 1.00 | 2.0 | 0.4 | 0.8 | 70 |
| | 2 | D-2 | 0.50 | 0.45 | 0.05 | 1.00 | 0.8 | 0.2 | 3.5 | 80 |
| | 3 | D-3 | 0.35 | 0.55 | 0.10 | 1.00 | 1.5 | 0.1 | 2.3 | 88 |
| | 4 | D-4 | 0.49 | 0.50 | 0.01 | 1.00 | 3.0 | 0.5 | 3.0 | 73 |
| | 5 | D-5 | 0.35 | 0.60 | 0.05 | 1.00 | 2.0 | 0.3 | 2.7 | 100 |
| | 6 | D-6 | 0.50 | 0.40 | 0.10 | 1.00 | 3.7 | 0.4 | 1.4 | 98 |
| | 7 | D-7 | 0.30 | 0.65 | 0.05 | 1.00 | 1.0 | 0.1 | 5.0 | 120 |
| | 8 | D-8 | 0.40 | 0.50 | 0.10 | 1.00 | 5.0 | 0.2 | 1.8 | 105 |
| CONVENTIONAL COATED DRILL | 1 | D-1 | 0.59 | 0.40 | 0.01 | 1.00 | 3.2 | — | — | 20 |
| | 2 | D-2 | 0.50 | 0.45 | 0.05 | 1.00 | 4.5 | — | — | 32 |
| | 3 | D-3 | 0.35 | 0.55 | 0.10 | 1.00 | 3.9 | — | — | 40 |
| | 4 | D-4 | 0.49 | 0.50 | 0.01 | 1.00 | 6.5 | — | — | 30 |
| | 5 | D-5 | 0.35 | 0.60 | 0.05 | 1.00 | 5.0 | — | — | 38 |
| | 6 | D-6 | 0.50 | 0.40 | 0.10 | 1.00 | 5.5 | — | — | 53 |
| | 7 | D-7 | 0.30 | 0.65 | 0.05 | 1.00 | 6.1 | — | — | 44 |
| | 8 | D-8 | 0.40 | 0.50 | 0.10 | 1.00 | 7.0 | — | — | 35 |

Example 10

Figure 2A:
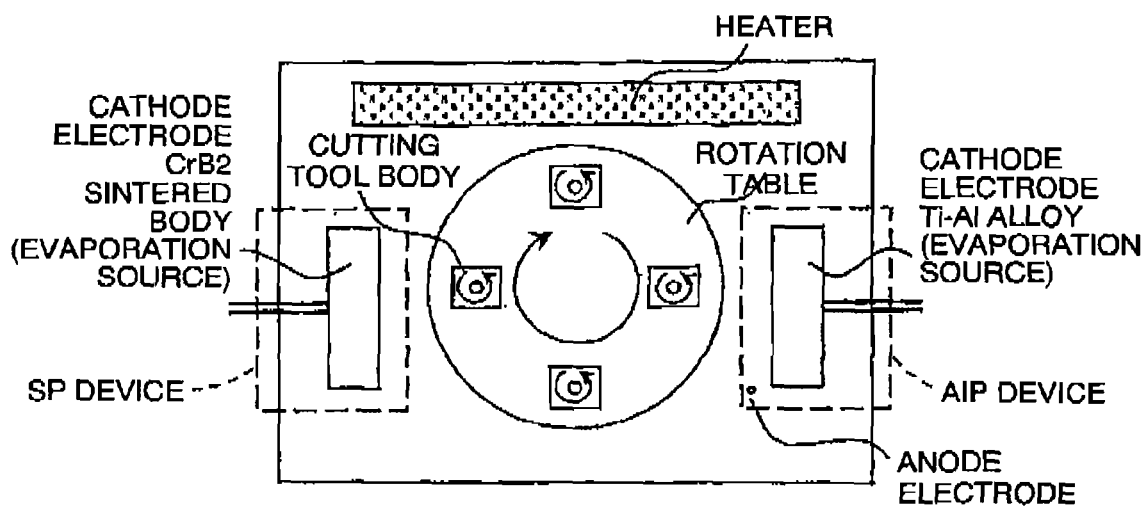
FIG. 2A is a schematic plan view of the deposition apparatus used in the formation of the surface coating layer as a constituent of the surface-coated cutting tool according to the second embodiment of the invention.
Figure 2B:
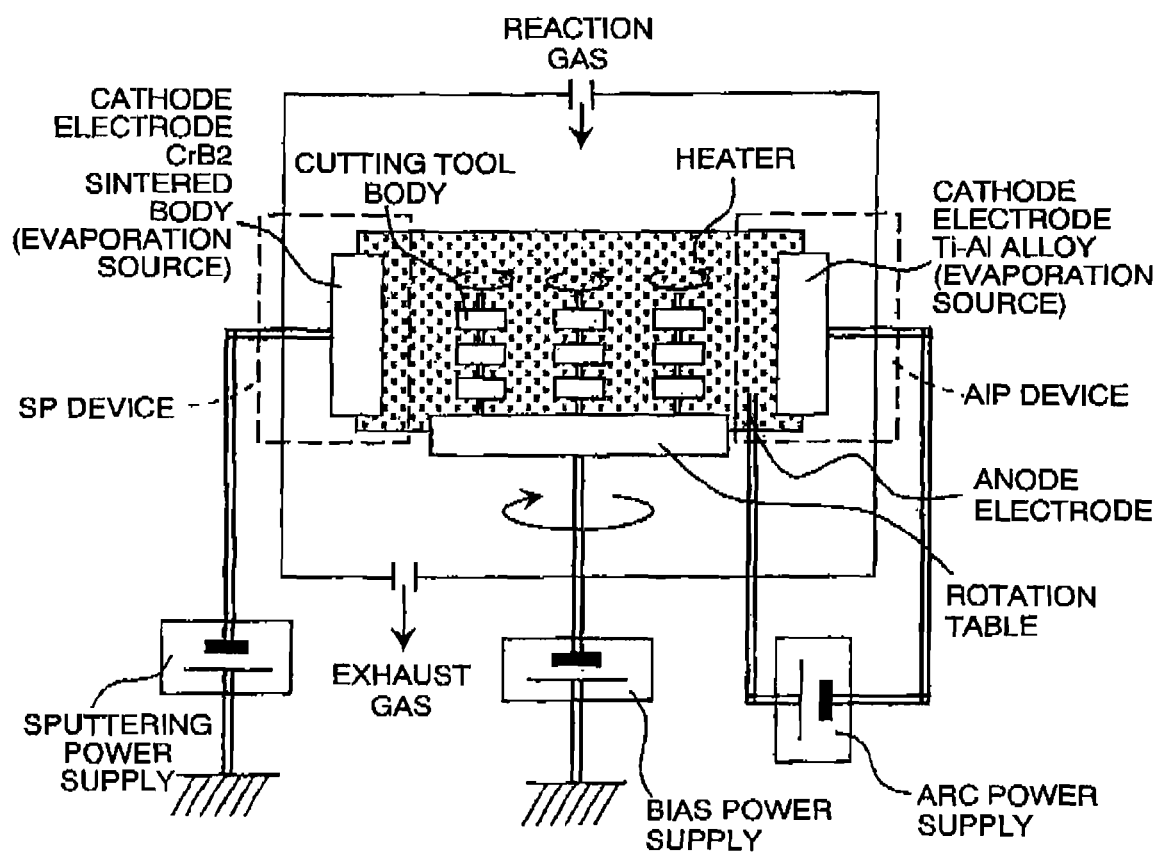
FIG. 2B is a schematic front view of a deposition apparatus shown in FIG. 2A.

The cutting tool bodies (inserts) used in Example 1 were placed on a rotation table along the circumference thereof at a predetermined radial distance from the center axis, in a deposition apparatus shown in FIGS. 2A and 2B. A Ti—Al alloy of a predetermined composition for forming the wear-resistant hard layer was placed as a cathode electrode (evaporation sources) of the AIP device. On the other side, a $CrB_2$ sintered body for forming the surface layer was placed as a cathode electrode (evaporation source) of the SP device.

(b) Firstly, while maintaining the inside of the apparatus under a vacuum condition of not more than 0.1 Pa by evacuation, the inside of the apparatus was heated to 500° C. by a heater. After that, by applying a DC bias voltage of −1000V to the cutting tool bodies rotating and spinning on the rotation table, arc discharge was generated by applying an electric current of 100 A between the Ti—Al alloy as the cathode electrode and anode electrode, thereby performing bombardment cleaning of the surfaces of the cutting tool bodies by the Ti—Al alloy.

(c) Next, a nitrogen gas was introduced as a reaction gas into the apparatus to maintain a reaction atmosphere of 3 Pa, and a DC bias voltage of −100 V was applied to the cutting tool bodies that were spinning and rotating on the rotation table. At the same time, arc discharge was generated by applying a current of 100 A between the cathode electrode of the Ti—Al alloy and the anode electrode, thereby vapor depositing the (Ti, Al)N layer having the target composition and the target layer thickness shown in Table 16 as the wear-resistant hard layer of the hard coating layer on the surface of the cutting tool bodies.

lower layer was stopped. While continuing the arc discharge between the T-Al alloy and the anode electrode, the nitrogen gas was replaced by introducing mixed gas of Ar and nitrogen ($N_2$:Ar=3:1 by volumetric ratio) into the apparatus to maintain a reaction atmosphere of 3 Pa. At the same time, sputtering of the $CrB_2$ sintered body placed as a cathode electrode (evaporation source) of the above-described SP device was generated by a sputtering output of 3 kW. By retaining the above-described state for a duration of 20 minutes, a composite boronitride layer containing Ti, Al, and Cr was produced as the bonding layer (By the subsequent measurement, the bonding layer showed an average thickness of 0.3 μm that was within a range of average thickness of 0.1 to 0.5 μm to ensure excellent bonding).

(e) Next, while continuing the sputtering between the $CrB_2$ sintered body placed as the cathode (evaporation source) of the SP device and the anode electrode under the same condition (sputtering output: 3 kW), the gas introduced into the apparatus was replaced from the mixed gas of Ar and nitrogen to Ar gas to maintain a reaction atmosphere of 0.5 Pa. At the same time, the arc discharge between the above-described Ti—Al alloy constituting the cathode for forming the wear-resistant hard layer was stopped. In that state, sputtering was performed for a duration corresponding to the target thickness of the $CrB_2$ layer. Thus the $CrB_2$ layer having target thickness presented in Table 16 was formed as the surface layer of the hard coating layer, and each of the coated inserts of the invention 1-16 was produced.

As a comparative example, the above-described cutting tool bodies (inserts) were placed in the deposition apparatus shown in FIG. 3. Conventional coated inserts 1-16 were produced by vapor-depositing the hard coating layer comprising (Ti, Al)N layer having the target composition and the target thickness shown in Table 17 using the same conditions as those described in Example 1.

Next, the above-described various coated inserts were respectively screw-mounted with a fixture-jig on an end of a cutting tool made of a tool steel. In that state, coated inserts of the invention 1-16, and conventional coated inserts 1-16 were applied to the following cutting tests.

Cutting tests on a Ti-based alloy were carried out under high-speed dry continuous cutting conditions (cutting condition A) comprising:
  workpiece: a round bar of Ti-6% Al-4% V alloy by mass %;
  cutting speed: 100 m/min;
  depth of cut: 1.5 mm;
  feed: 0.2 mm/rev; and
  cutting time: 5 minutes.

Cutting tests on a high-Si Si—Al system alloy were carried out under high-speed, dry, continuous cutting conditions (cutting condition B) comprising:
  workpiece: a round bar of Al-13% Si alloy by mass %;
  cutting speed: 300 m/min;
  depth of cut: 2.0 mm;
  feed: 0.15 mm/rev; and
  cutting time: 10 minutes.

In addition, cutting tests on a high-Si Al—Si system alloy were carried out under high-speed dry intermittent cutting conditions (condition C) comprising:
  workpiece: a round bar with 4 grooves formed in the longitudinal direction at equal spaces, of Al-18% Si alloy by mass %;
  cutting speed: 300 m/min;
  depth of cut: 1.5 mm;
  feed: 0.18 mm/rev; and
  cutting time: 10 minutes.

In each of the cutting tests, widths of flank wear of the cutting edges were measured. The results are listed in Tables 16 and 17.

TABLE 16

| Type | | SYMBOL OF CUTTING TOOL BODY | HARD COATING LAYER | | | | Width of flank wear (mm) | | |
|---|---|---|---|---|---|---|---|---|---|
| | | | LOWER LAYER | | | UPPER LAYER TARGET THICKNESS OF $CrB_2$ LAYER (μm) | | | |
| | | | TARGET COMPOSITION (atomic ratio) | | | TARGET THICKNESS (μm) | CUTTING CONDITION A | CUTTING CONDITION B | CUTTING CONDITION C |
| | | | Ti | Al | N | | | | |
| COATED INSERT OF THE INVENTION | 1 | A-1 | 0.38 | 0.62 | 1.00 | 3.5 | 0.8 | 0.12 | 0.15 | 0.10 |
| | 2 | A-2 | 0.25 | 0.75 | 1.00 | 0.8 | 2.5 | 0.13 | 0.14 | 0.16 |
| | 3 | A-3 | 0.42 | 0.58 | 1.00 | 2.1 | 4.8 | 0.15 | 0.12 | 0.12 |
| | 4 | A-4 | 0.55 | 0.45 | 1.00 | 1.0 | 1.2 | 0.17 | 0.16 | 0.11 |
| | 5 | A-5 | 0.36 | 0.64 | 1.00 | 4.3 | 3.3 | 0.12 | 0.12 | 0.10 |
| | 6 | A-6 | 0.50 | 0.50 | 1.00 | 2.0 | 2.7 | 0.14 | 0.11 | 0.13 |
| | 7 | A-7 | 0.42 | 0.58 | 1.00 | 3.2 | 4.1 | 0.16 | 0.13 | 0.18 |
| | 8 | A-8 | 0.58 | 0.42 | 1.00 | 2.6 | 3.5 | 0.11 | 0.16 | 0.18 |
| | 9 | A-9 | 0.60 | 0.40 | 1.00 | 4.0 | 2.9 | 0.10 | 0.14 | 0.13 |
| | 10 | A-10 | 0.40 | 0.60 | 1.00 | 3.4 | 4.0 | 0.18 | 0.12 | 0.15 |
| | 11 | B-1 | 0.35 | 0.65 | 1.00 | 2.5 | 1.6 | 0.16 | 0.10 | 0.14 |
| | 12 | B-2 | 0.40 | 0.60 | 1.00 | 4.3 | 2.8 | 0.14 | 0.09 | 0.17 |
| | 13 | B-3 | 0.58 | 0.42 | 1.00 | 5.0 | 3.2 | 0.17 | 0.18 | 0.14 |
| | 14 | B-4 | 0.43 | 0.57 | 1.00 | 1.5 | 5.0 | 0.16 | 0.12 | 0.16 |
| | 15 | B-5 | 0.30 | 0.70 | 1.00 | 4.5 | 2.2 | 0.16 | 0.13 | 0.13 |
| | 16 | B-6 | 0.55 | 0.45 | 1.00 | 2.3 | 4.5 | 0.13 | 0.10 | 0.15 |

TABLE 17

| Type | | SYMBOL OF CUTTING TOOL BODY | HARD COATING LAYER | | | | Width of flank wear (mm) | | |
|---|---|---|---|---|---|---|---|---|---|
| | | | TARGET COMPOSITION (atomic ratio) | | | TARGET THICKNESS (μm) | CUTTING CONDITION A | CUTTING CONDITION B | CUTTING CONDITION C |
| | | | Ti | Al | N | | | | |
| CONVENTIONAL COATED INSERT | 1 | A-1 | 0.38 | 0.62 | 1.00 | 4.3 | 0.32 | 0.30 | 0.31 |
| | 2 | A-2 | 0.25 | 0.75 | 1.00 | 3.3 | 0.41 | 0.34 | 0.32 |
| | 3 | A-3 | 0.42 | 0.58 | 1.00 | 6.9 | 0.37 | 0.28 | 0.30 |
| | 4 | A-4 | 0.55 | 0.45 | 1.00 | 2.2 | 0.35 | 0.32 | 0.35 |
| | 5 | A-5 | 0.36 | 0.64 | 1.00 | 7.6 | 0.29 | 0.39 | 0.29 |
| | 6 | A-6 | 0.50 | 0.50 | 1.00 | 4.7 | 0.40 | 0.30 | 0.34 |
| | 7 | A-7 | 0.42 | 0.58 | 1.00 | 7.3 | 0.33 | 0.36 | 0.37 |
| | 8 | A-8 | 0.58 | 0.42 | 1.00 | 6.1 | 0.31 | 0.29 | 0.30 |
| | 9 | A-9 | 0.60 | 0.40 | 1.00 | 6.9 | 0.42 | 0.32 | 0.35 |
| | 10 | A-10 | 0.40 | 0.60 | 1.00 | 7.4 | 0.36 | 0.30 | 0.36 |
| | 11 | B-1 | 0.35 | 0.65 | 1.00 | 4.1 | 0.33 | 0.33 | 0.28 |

TABLE 17-continued

| Type | SYMBOL OF CUTTING TOOL BODY | HARD COATING LAYER | | | | | | |
|---|---|---|---|---|---|---|---|---|
| | | TARGET COMPOSITION (atomic ratio) | | | TARGET THICKNESS | Width of flank wear (mm) | | |
| | | Ti | Al | N | (μm) | CUTTING CONDITION A | CUTTING CONDITION B | CUTTING CONDITION C |
| 12 | B-2 | 0.40 | 0.60 | 1.00 | 7.1 | 0.30 | 0.34 | 0.34 |
| 13 | B-3 | 0.58 | 0.42 | 1.00 | 8.2 | 0.39 | 0.28 | 0.40 |
| 14 | B-4 | 0.43 | 0.57 | 1.00 | 6.5 | 0.30 | 0.31 | 0.38 |
| 15 | B-5 | 0.30 | 0.70 | 1.00 | 6.7 | 0.34 | 0.35 | 0.32 |
| 16 | B-6 | 0.55 | 0.45 | 1.00 | 6.8 | 0.38 | 0.37 | 0.29 |

Example 11

The cutting tool bodies (end mills) used in Example 2 were placed in the vapor-deposition apparatus shown in FIGS. 2A and 2B. Using the same conditions as the above-described Example 10, coated end mills 1-8 of the invention were produced by vapor-depositing the hard coating layer having the target composition and the target thickness shown in Table 18.

As a comparative example, the above-described cutting tool bodies (end mills) were placed in the deposition apparatus shown in FIG. 3. Using the same conditions as the above-described Example 10, conventional coated end mills 1-8 were produced by vapor-depositing the hard coating layer comprising (Ti, Al)N layer having the target composition and the target thickness shown in Table 18.

Next, the above-described coated end mills 1 to 8 of the invention, and conventional coated end mills 1 to 8 were applied to the cutting tests.

The coated end mills 1 to 3 of the invention, and comparative coated end mills 1 to 3 were applied to high-speed dry slotting of a Ti-based alloy under conditions comprising:
workpiece: a plate of a Ti-based alloy (by mass %, an alloy of Ti-3% Al-2.5% V) having a plate dimension of 100 mm×250 mm and a thickness of 50 mm;
cutting speed: 100 m/min;
depth of slot (depth of cut): 2 mm; and
table feed: 800 mm/min.

The coated end mills 4 to 6 of the invention, and comparative coated end mills 4 to 6 were applied to high-speed dry slotting of a Ti-based alloy under conditions comprising:
workpiece: a plate of a Ti-based alloy (by mass %, an alloy of Ti-6% Al-4% V) having a plate dimension of 100 mm×250 mm and a thickness of 50 mm;
cutting speed: 150 m/min;
depth of slot (depth of cut): 4 mm; and
table feed: 960 mm/min.

The coated end mills 7 and 8 of the invention, and conventional coated end mills 7 and 8 were applied to high-speed dry slotting of a high-Si Al—Si system alloy under conditions comprising:
workpiece: a plate of a high-Si Al—Si system alloy (by mass %, an alloy of Al-18% Si) having a plate dimension of 100 mm×250 mm and a thickness of 50 mm;
cutting speed: 300 m/min;
depth of slot (depth of cut): 12 mm; and
table feed: 950 mm/min.

In each slotting test, the length of the cut slot by the end mill until the end of its tool life was measured, where the end mill was regarded to reach the end of its tool life when a width of flank wear of a peripheral edge of a cutting edge of the end mill reached 0.1 mm. The results are respectively listed in Table 18.

TABLE 18

| Type | | SYMBOL OF CUTTING TOOL BODY | HARD COATING LAYER | | | | UPPER LAYER TARGET THICKNESS OF $CrB_2$ LAYER (μm) | LENGTH OF CUT SLOT (m) |
|---|---|---|---|---|---|---|---|---|
| | | | LOWER LAYER | | | | | |
| | | | TARGET COMPOSITION (atomic ratio) | | | TARGET THICKNESS | | |
| | | | Ti | Al | N | (μm) | | |
| COATED END MILL OF THE INVENTION | 1 | C-1 | 0.36 | 0.64 | 1.00 | 3.2 | 2.7 | 31 |
| | 2 | C-2 | 0.60 | 0.40 | 1.00 | 0.8 | 3.6 | 47 |
| | 3 | C-3 | 0.50 | 0.50 | 1.00 | 1.5 | 0.8 | 27 |
| | 4 | C-4 | 0.45 | 0.55 | 1.00 | 2.3 | 2.4 | 40 |
| | 5 | C-5 | 0.38 | 0.62 | 1.00 | 4.3 | 5.0 | 36 |
| | 6 | C-6 | 0.40 | 0.60 | 1.00 | 3.8 | 4.2 | 38 |
| | 7 | C-7 | 0.25 | 0.75 | 1.00 | 2.6 | 3.3 | 122 |
| | 8 | C-8 | 0.52 | 0.48 | 1.00 | 5.0 | 4.6 | 152 |
| CONVENTIONAL COATED END MILL | 1 | C-1 | 0.36 | 0.64 | 1.00 | 5.9 | — | 10 |
| | 2 | C-2 | 0.60 | 0.40 | 1.00 | 4.4 | — | 15 |
| | 3 | C-3 | 0.50 | 0.50 | 1.00 | 2.3 | — | 8 |
| | 4 | C-4 | 0.45 | 0.55 | 1.00 | 4.7 | — | 16 |

TABLE 18-continued

|  | | SYMBOL OF CUTTING TOOL | HARD COATING LAYER | | | | | |
|---|---|---|---|---|---|---|---|---|
| | | | LOWER LAYER | | | | UPPER LAYER TARGET | LENGTH |
| | | | TARGET COMPOSITION (atomic ratio) | | | TARGET THICKNESS | THICKNESS OF CrB$_2$ LAYER | OF CUT SLOT |
| Type | | BODY | Ti | Al | N | (μm) | (μm) | (m) |
| | 5 | C-5 | 0.38 | 0.62 | 1.00 | 9.3 | — | 15 |
| | 6 | C-6 | 0.40 | 0.60 | 1.00 | 8.0 | — | 20 |
| | 7 | C-7 | 0.25 | 0.75 | 1.00 | 5.9 | — | 60 |
| | 8 | C-8 | 0.52 | 0.48 | 1.00 | 9.6 | — | 85 |

Example 12

The cutting tool bodies (drills) used in Example 3 were placed in the vapor-deposition apparatus shown in FIGS. 2A and 2B. Using the same conditions as the above-described Example 10, coated drills 1-8 of the invention were produced by vapor-depositing the hard coating layer having the target composition and the target thickness shown in Table 19.

As a comparative example, the above-described cutting tool bodies (drills) were placed in the deposition apparatus shown in FIG. 3. Using the same conditions as the above-described Example 10, conventional coated drills 1-8 were produced by vapor-depositing the hard coating layer comprising (Ti, Al)N layer having the target composition and the target thickness shown in Table 19.

Next, the above-described coated drills 1 to 8 of the invention, and conventional coated drills 1 to 8 were applied to the drilling tests.

The coated drills 1 to 3 of the invention, and conventional coated drills 1 to 3 were applied to high-speed wet drilling tests of Ti-based alloy under conditions comprising:

workpiece: a plate of a Ti-based alloy (by mass %, an alloy of Ti-3% Al-2.5% V) having a plate dimension of 100 mm×250 mm and a thickness of 50 mm;
cutting speed: 50 m/min;
feed: 0.2 mm/rev; and
depth of a hole: 10 mm.

The coated drills 4 to 6 of the invention, and conventional coated drills 4 to 6 were applied to high-speed wet drilling tests of a Ti-based alloy under conditions comprising:

workpiece: a plate of a Ti-based alloy (by mass %, Ti-6% Al-4% V alloy) having a plate dimension of 100 mm×250 mm and a thickness of 50 mm;
cutting speed: 75 m/min;
feed: 0.15 mm/rev; and
depth of a hole: 15 mm.

The coated drills 7 and 8 of the invention, and conventional coated drills 7 and 8 were applied to high-speed wet drilling tests of a high-Si Al—Si system alloy under conditions comprising:

workpiece: a plate of a high-Si Al—Si-based alloy (by mass %, an alloy of Al-18% Si) having a plate dimension of 100 mm×250 mm and a thickness of 50 mm;
cutting speed: 120 m/min;
feed: 0.4 mm/rev; and
depth of a hole: 30 mm.

In each test of the high-speed wet drilling (using a water-soluble cutting fluid), the numbers of holes drilled until the time when the width of flank wear of the cutting edge of the end of the drill reached 0.3 mm were counted. The results are listed in Table 19.

TABLE 19

| | | SYMBOL OF CUTTING TOOL | HARD COATING LAYER | | | | | |
|---|---|---|---|---|---|---|---|---|
| | | | LOWER LAYER | | | | UPPER LAYER TARGET | |
| | | | TARGET COMPOSITION (atomic ratio) | | | TARGET THICKNESS | THICKNESS OF CrB$_2$ LAYER | NUMBER OF DRILLING |
| Type | | BODY | Ti | Al | N | (μm) | (μm) | (holes) |
| COATED DRILL OF THE INVENTION | 1 | D-1 | 0.42 | 0.58 | 1.00 | 5.0 | 3.0 | 85 |
| | 2 | D-2 | 0.60 | 0.40 | 1.00 | 3.1 | 4.8 | 95 |
| | 3 | D-3 | 0.36 | 0.64 | 1.00 | 4.5 | 1.6 | 70 |
| | 4 | D-4 | 0.40 | 0.60 | 1.00 | 0.8 | 5.0 | 110 |
| | 5 | D-5 | 0.33 | 0.67 | 1.00 | 4.6 | 4.2 | 85 |
| | 6 | D-5 | 0.43 | 0.57 | 1.00 | 3.4 | 2.6 | 120 |
| | 7 | D-7 | 0.50 | 0.50 | 1.00 | 1.2 | 0.8 | 59 |
| | 8 | D-8 | 0.25 | 0.75 | 1.00 | 2.7 | 3.5 | 74 |
| CONVENTIONAL COATED DRILL | 1 | D-1 | 0.42 | 0.58 | 1.00 | 8.0 | — | 40 |
| | 2 | D-2 | 0.60 | 0.40 | 1.00 | 7.9 | — | 55 |
| | 3 | D-3 | 0.36 | 0.64 | 1.00 | 6.1 | — | 30 |

TABLE 19-continued

| | | | HARD COATING LAYER | | | | |
|---|---|---|---|---|---|---|---|
| | | SYMBOL OF CUTTING TOOL | LOWER LAYER | | | UPPER LAYER TARGET THICKNESS OF CrB$_2$ LAYER (μm) | NUMBER OF DRILLING (holes) |
| | | | TARGET COMPOSITION (atomic ratio) | | TARGET THICKNESS (μm) | | |
| Type | | BODY | Ti | Al | N | | |
| | 4 | D-4 | 0.40 | 0.60 | 1.00 | 5.8 | — | 25 |
| | 5 | D-5 | 0.33 | 0.67 | 1.00 | 8.8 | — | 45 |
| | 6 | D-6 | 0.43 | 0.57 | 1.00 | 6.0 | — | 60 |
| | 7 | D-7 | 0.50 | 0.50 | 1.00 | 2.0 | — | 20 |
| | 8 | D-8 | 0.25 | 0.75 | 1.00 | 6.2 | — | 38 |

Example 13

The cutting tool bodies (inserts) used in Example 1 were placed in the vapor-deposition apparatus shown in FIGS. 2A and 2B, coated inserts 1-16 of the invention were produced by vapor-depositing the hard coating layer having the target composition, and the target thickness shown in Table 20. In the above-described vapor deposition, as the cathode electrode (evaporation source) for forming the lower layer, Ti—Al—Si alloy having a predetermined composition was used as an alternative to the Ti—Al alloy. The other vapor-deposition conditions were similar to those described in Example 10.

As a comparative example, the above-described cutting tool bodies (inserts) were placed in the deposition apparatus shown in FIG. 3. Conventional coated inserts 1-16 were produced by vapor-depositing the hard coating layer comprising (Ti, Al, Si)N layer having the target composition and the target thickness shown in Table 21. In the above-described vapor deposition, as the cathode electrode (evaporation source) of the AIP device, Ti—Al—Si alloy having a composition selected from various compositions was used as an alternatives to the Ti—Al alloy. The other coated conditions were similar to those described in Example 10.

Next, the above-described various coated inserts were respectively screw-mounted with a fixture-jig on an end of a cutting tool made of a tool steel. In that state, coated inserts of the invention 1-16, and conventional coated inserts 1-16 were applied to the following cutting tests.

Cutting tests on a Ni-based alloy were carried out under high-speed dry continuous cutting conditions (cutting condition A) comprising:

workpiece: a round bar of Ni-based alloy having a composition of Ni-19% Cr-18.5% Fe-5.2% Cd-5% Ta-3% Mo-0.9% Ti-0.5% Al by mass %;

cutting speed: 65 m/min;

depth of cut: 1 mm;

feed: 0.1 mm/rev; and cutting time: 5 minutes.

Cutting tests on a Co-based alloy were carried out under high-speed, dry, continuous cutting conditions (cutting condition B) comprising:

workpiece: a round bar of Co-based alloy having a composition of Co-23% Cr-6% Mo-2% Ni-1% Fe-0.6% Si-0.4% C by mass %;

cutting speed: 60 m/min;

depth of cut: 0.8 mm;

feed: 0.15 mm/rev; and cutting time: 4 minutes.

In addition, cutting tests on a Ti-based alloy were carried out under high-speed dry intermittent cutting conditions (condition C) comprising:

workpiece: a round bar of Ti-based alloy with 4 grooves formed in the longitudinal direction at equal spaces, having a composition of Ti-6% Al-4% V by mass %;

cutting speed: 60 m/min;

depth of cut: 1.2 mm;

feed: 0.2 mm/rev; and cutting time: 5 minutes.

In each of the cutting tests, widths of flank wear of the cutting edges were measured. The results are listed in Tables 20 and 21.

TABLE 20

| | | | HARD COATING LAYER | | | | | | | | |
|---|---|---|---|---|---|---|---|---|---|---|---|
| | | SYMBOL OF CUTTING TOOL | LOWER LAYER | | | | | UPPER LAYER TARGET THICKNESS OF CrB$_2$ LAYER (μm) | Width of flank wear (mm) | | |
| | | | TARGET COMPOSITION (atomic ratio) | | | | TARGET THICKNESS (μm) | | CUTTING CONDITION A | CUTTING CONDITION B | CUTTING CONDITION C |
| Type | | BODY | Ti | Al | Si | N | | | | | |
| COATED INSERT | 1 | A-1 | 0.49 | 0.50 | 0.01 | 1.00 | 1.3 | 2.5 | 0.15 | 0.16 | 0.17 |
| OF THE | 2 | A-2 | 0.55 | 0.40 | 0.05 | 1.00 | 3.5 | 4.0 | 0.12 | 0.10 | 0.12 |
| INVENTION | 3 | A-3 | 0.45 | 0.45 | 0.10 | 1.00 | 3.0 | 0.8 | 0.18 | 0.17 | 0.19 |
| | 4 | A-4 | 0.49 | 0.50 | 0.01 | 1.00 | 2.2 | 1.3 | 0.16 | 0.18 | 0.18 |

TABLE 20-continued

| | | | HARD COATING LAYER | | | | | | | |
|---|---|---|---|---|---|---|---|---|---|---|
| | SYMBOL OF CUTTING TOOL | | LOWER LAYER | | | | UPPER LAYER TARGET THICKNESS OF CrB$_2$ LAYER | Width of flank wear (mm) | | |
| | | | TARGET COMPOSITION (atomic ratio) | | | TARGET THICKNESS | | CUTTING CONDI- | CUTTING CONDI- | CUTTING CONDI- |
| Type | | BODY | Ti | Al | Si | N | (µm) | (µm) | TION A | TION B | TION C |
| | 5 | A-5 | 0.40 | 0.55 | 0.05 | 1.00 | 1.4 | 2.2 | 0.21 | 0.18 | 0.20 |
| | 6 | A-6 | 0.30 | 0.60 | 0.10 | 1.00 | 0.8 | 1.1 | 0.20 | 0.21 | 0.19 |
| | 7 | A-7 | 0.59 | 0.40 | 0.01 | 1.00 | 3.0 | 1.7 | 0.16 | 0.15 | 0.18 |
| | 8 | A-8 | 0.60 | 0.35 | 0.05 | 1.00 | 4.2 | 3.0 | 0.10 | 0.10 | 0.14 |
| | 9 | A-9 | 0.55 | 0.35 | 0.10 | 1.00 | 3.0 | 2.3 | 0.13 | 0.12 | 0.13 |
| | 10 | A-10 | 0.34 | 0.65 | 0.01 | 1.00 | 2.6 | 5.0 | 0.11 | 0.10 | 0.12 |
| | 11 | B-1 | 0.35 | 0.60 | 0.05 | 1.00 | 1.2 | 2.5 | 0.16 | 0.15 | 0.16 |
| | 12 | B-2 | 0.40 | 0.50 | 0.10 | 1.00 | 5.0 | 0.9 | 0.12 | 0.11 | 0.13 |
| | 13 | B-3 | 0.59 | 0.40 | 0.01 | 1.00 | 1.8 | 3.7 | 0.14 | 0.13 | 0.14 |
| | 14 | B-4 | 0.60 | 0.35 | 0.05 | 1.00 | 4.3 | 3.3 | 0.10 | 0.09 | 0.13 |
| | 15 | B-5 | 0.25 | 0.65 | 0.10 | 1.00 | 3.2 | 2.6 | 0.14 | 0.12 | 0.16 |
| | 16 | B-6 | 0.34 | 0.65 | 0.01 | 1.00 | 2.5 | 2.1 | 0.16 | 0.14 | 0.15 |

TABLE 21

| | SYMBOL OF CUTTING TOOL | | HARD COATING LAYER | | | | | Width of flank wear (mm) | | |
|---|---|---|---|---|---|---|---|---|---|---|
| | | | TARGET COMPOSITION (atomic ratio) | | | | TARGET THICKNESS | CUTTING | CUTTING | CUTTING |
| Type | | BODY | Ti | Al | Si | N | (µm) | CONDITION A | CONDITION B | CONDITION C |
| CONVENTIONAL COATED INSERT | 1 | A-1 | 0.49 | 0.50 | 0.01 | 1.00 | 3.8 | 0.39 | 0.36 | 0.42 |
| | 2 | A-2 | 0.55 | 0.40 | 0.05 | 1.00 | 7.5 | 0.30 | 0.29 | 0.33 |
| | 3 | A-3 | 0.45 | 0.45 | 0.10 | 1.00 | 3.8 | 0.38 | 0.35 | 0.39 |
| | 4 | A-4 | 0.49 | 0.50 | 0.01 | 1.00 | 3.5 | 0.41 | 0.37 | 0.40 |
| | 5 | A-5 | 0.40 | 0.55 | 0.05 | 1.00 | 3.6 | 0.39 | 0.38 | 0.40 |
| | 6 | A-6 | 0.30 | 0.60 | 0.10 | 1.00 | 1.9 | 0.42 | 0.40 | 0.39 |
| | 7 | A-7 | 0.59 | 0.40 | 0.01 | 1.00 | 4.7 | 0.35 | 0.34 | 0.35 |
| | 8 | A-8 | 0.60 | 0.35 | 0.05 | 1.00 | 7.2 | 0.30 | 0.29 | 0.32 |
| | 9 | A-9 | 0.55 | 0.35 | 0.10 | 1.00 | 5.3 | 0.32 | 0.30 | 0.34 |
| | 10 | A-10 | 0.34 | 0.65 | 0.01 | 1.00 | 7.6 | 0.29 | 0.28 | 0.32 |
| | 11 | B-1 | 0.35 | 0.60 | 0.05 | 1.00 | 3.7 | 0.38 | 0.36 | 0.38 |
| | 12 | B-2 | 0.40 | 0.50 | 0.10 | 1.00 | 5.9 | 0.32 | 0.31 | 0.33 |
| | 13 | B-3 | 0.59 | 0.40 | 0.01 | 1.00 | 5.5 | 0.34 | 0.32 | 0.35 |
| | 14 | B-4 | 0.60 | 0.35 | 0.05 | 1.00 | 7.6 | 0.30 | 0.29 | 0.32 |
| | 15 | B-5 | 0.25 | 0.65 | 0.10 | 1.00 | 5.8 | 0.36 | 0.33 | 0.36 |
| | 16 | B-6 | 0.34 | 0.65 | 0.01 | 1.00 | 4.6 | 0.37 | 0.35 | 0.38 |

Example 14

The cutting tool bodies (end mills) used in Example 2 were placed in the vapor-deposition apparatus shown in FIGS. 2A and 2B. Using the same conditions as the above-described Example 13, coated end mills 1-8 of the invention were produced by vapor-depositing the hard coating layer having the target composition and the target thickness shown in Table 22.

As a comparative example, the above-described cutting tool bodies (end mills) were placed in the deposition apparatus shown in FIG. 3. Using the same conditions as the above-described Example 13, conventional coated end mills 1-8 were produced by vapor-depositing the hard coating layer comprising (Ti, Al, Si)N layer having the target composition and the target thickness shown in Table 22.

Next, the above-described coated end mills 1 to 8 of the invention, and conventional coated end mills 1 to 8 were applied to the cutting tests.

The coated end mills 1 to 3 of the invention, and comparative coated end mills 1 to 3 were applied to high-speed dry slotting of a Ti-based alloy under conditions comprising:
workpiece: a plate of a Ti-based alloy having a plate dimension of 100 mm×250 mm and a thickness of 50 mm, and having a composition of Co-20% Cr-15% W-10% Ni-1.5% Mn-1% Si-1% Fe-0.12% C by mass percent;
cutting speed: 50 m/min;
depth of slot (depth of cut): 2 mm; and
table feed: 200 mm/min.

The coated end mills 4 to 6 of the invention, and comparative coated end mills 4 to 6 were applied to high-speed dry slotting of a Ni-based alloy under conditions comprising:
workpiece: a plate of a Ni-based alloy having a plate dimension of 100 mm×250 mm and a thickness of 50 mm, and having a composition of Ni-19% Cr-14% Co-4.5% Mo-2.5% Ti-2% Fe-1.2% Al-0.7% Mn-0.4% Si by mass %;
cutting speed: 55 m/min;

depth of slot (depth of cut): 3 mm; and
table feed: 250 mm/min.

The coated end mills 7 and 8 of the invention, and comparative coated end mills 7 and 8 were applied to high-speed dry slotting of a Ti-based alloy under conditions comprising:
workpiece: a plate of Ti-based alloy having a plate dimension of 100 mm×250 mm and a thickness of 50 mm, and having a composition of Ti-3% Al-2.5% V by mass %;
cutting speed: 45 m/min;
depth of slot (depth of cut): 5 mm; and
table feed: 120 mm/min.

In each slotting test, the length of the cut slot by the end mill until the end of its tool life was measured, where the end mill was regarded to reach the end of its tool life when a width of flank wear of a peripheral edge of a cutting edge of the end mill reached 0.1 mm. The results are respectively listed in Table 22.

The coated drills 1 to 3 of the invention, and conventional coated drills 1 to 3 were applied to high-speed wet drilling tests of Ti-based alloy under conditions comprising:
workpiece: a plate of a Ti-based alloy having a plate dimension of 100 mm×250 mm and a thickness of 50 mm, and having a composition of Ti-3% Al-2.5% V by mass percent;
cutting speed: 40 m/min;
feed: 0.2 mm/rev; and
depth of a hole: 8 mm.

The coated drills 4 to 6 of the invention, and conventional coated drills 4 to 6 were applied to high-speed wet drilling tests of a Co-based alloy under conditions comprising:
workpiece: a plate of a Co-based alloy having a plate dimension of 100 mm×250 mm and a thickness of 50 mm, and a composition of Co-20% Cr-20% Ni-4% Mo-4% W-4% W-4% Cd-3% Fe-1.5% Mn-0.7% Si-0.38% C by mass %;
cutting speed: 45 m/min;

TABLE 22

| Type | SYMBOL OF CUTTING TOOL BODY | HARD COATING LAYER | | | | | UPPER LAYER TARGET THICKNESS OF $CrB_2$ LAYER (μm) | LENGTH OF CUT SLOT (m) |
|---|---|---|---|---|---|---|---|---|
| | | LOWER LAYER | | | | | | |
| | | TARGET COMPOSITION (atomic ratio) | | | | TARGET THICKNESS (μm) | | |
| | | Ti | Al | Si | N | | | |
| COATED END MILL OF THE INVENTION | 1 C-1 | 0.25 | 0.70 | 0.05 | 1.00 | 0.8 | 1.6 | 30 |
| | 2 C-2 | 0.45 | 0.45 | 0.10 | 1.00 | 3.0 | 1.1 | 42 |
| | 3 C-3 | 0.39 | 0.60 | 0.01 | 1.00 | 1.5 | 0.8 | 38 |
| | 4 C-4 | 0.35 | 0.55 | 0.10 | 1.00 | 2.3 | 3.0 | 40 |
| | 5 C-5 | 0.34 | 0.65 | 0.01 | 1.00 | 3.2 | 2.6 | 35 |
| | 6 C-6 | 0.55 | 0.40 | 0.05 | 1.00 | 1.8 | 5.0 | 50 |
| | 7 C-7 | 0.60 | 0.35 | 0.05 | 1.00 | 5.0 | 1.0 | 45 |
| | 8 C-8 | 0.40 | 0.50 | 0.10 | 1.00 | 4.1 | 2.1 | 47 |
| CONVENTIONAL COATED END MILL | 1 C-1 | 0.25 | 0.70 | 0.05 | 1.00 | 2.4 | — | 8 |
| | 2 C-2 | 0.45 | 0.45 | 0.10 | 1.00 | 4.1 | — | 15 |
| | 3 C-3 | 0.39 | 0.60 | 0.01 | 1.00 | 2.3 | — | 12 |
| | 4 C-4 | 0.35 | 0.55 | 0.10 | 1.00 | 5.3 | — | 14 |
| | 5 C-5 | 0.34 | 0.65 | 0.01 | 1.00 | 5.8 | — | 16 |
| | 6 C-6 | 0.55 | 0.40 | 0.05 | 1.00 | 6.8 | — | 18 |
| | 7 C-7 | 0.60 | 0.35 | 0.05 | 1.00 | 6.0 | — | 13 |
| | 8 C-8 | 0.40 | 0.50 | 0.10 | 1.00 | 6.2 | — | 15 |

Example 15

The cutting tool bodies (drills) used in Example 3 were placed in the vapor-deposition apparatus shown in FIGS. 2A and 2B. Using the same conditions as the above-described Example 13, coated drills 1-8 of the invention were produced by vapor-depositing the hard coating layer having the target composition and the target thickness shown in Table 23.

As a comparative example, the above-described cutting tool bodies (drills) were placed in the deposition apparatus shown in FIG. 3. Using the same conditions as the above-described Example 13, conventional coated drills 1-8 were produced by vapor-depositing the hard coating layer comprising (Ti, Al, Si)N layer having the target composition and the target thickness shown in Table 23.

Next, the above-described coated drills 1 to 8 of the invention, and conventional coated drills 1 to 8 were applied to the drilling tests.

feed: 0.15 mm/rev; and
depth of a hole: 14 mm.

The coated drills 7 and 8 of the invention, and conventional coated drills 7 and 8 were applied to high-speed wet drilling tests of a Ni-based alloy under conditions comprising:
workpiece: a plate of a Ni-based alloy having a plate dimension of 100 mm×250 mm and a thickness of 50 mm, and a composition of Ni-19% Cr-18.5% Fe-5.2% Cd-5% Ta-3% Mo-0.9% Ti-0.5% Al-0.3% Si-0.2% Mn-0.05% Cu-0.04% C by mass %;
cutting speed: 55 m/min;
feed: 0.25 mm/rev; and
depth of a hole: 25 mm.

In each test of the high-speed wet drilling (using a water-soluble cutting fluid), the numbers of holes drilled until the time when the width of flank wear of the cutting edge of the end of the drill reached 0.3 mm were counted. The results are listed in Table 23.

TABLE 23

| Type | | SYMBOL OF CUTTING TOOL BODY | HARD COATING LAYER | | | | UPPER LAYER TARGET THICKNESS OF CrB$_2$ LAYER (µm) | NUMBER OF DRILLING (holes) |
|---|---|---|---|---|---|---|---|---|
| | | | LOWER LAYER | | | | | |
| | | | TARGET COMPOSITION (atomic ratio) | | | | TARGET THICKNESS (µm) | |
| | | | Ti | Al | Si | N | | |
| COATED DRILL OF THE INVENTION | 1 | D-1 | 0.59 | 0.40 | 0.01 | 1.00 | 2.7 | 2.0 | 85 |
| | 2 | D-2 | 0.50 | 0.45 | 0.05 | 1.00 | 1.6 | 0.8 | 65 |
| | 3 | D-3 | 0.35 | 0.55 | 0.10 | 1.00 | 0.8 | 1.4 | 57 |
| | 4 | D-4 | 0.49 | 0.50 | 0.01 | 1.00 | 2.4 | 2.9 | 88 |
| | 5 | D-5 | 0.35 | 0.60 | 0.05 | 1.00 | 3.0 | 2.2 | 85 |
| | 6 | D-6 | 0.50 | 0.40 | 0.10 | 1.00 | 2.0 | 5.0 | 110 |
| | 7 | D-7 | 0.30 | 0.65 | 0.05 | 1.00 | 3.7 | 4.0 | 90 |
| | 8 | D-8 | 0.40 | 0.50 | 0.10 | 1.00 | 5.0 | 1.5 | 82 |
| CONVENTIONAL COATED DRILL | 1 | D-1 | 0.59 | 0.40 | 0.01 | 1.00 | 4.7 | — | 28 |
| | 2 | D-2 | 0.50 | 0.45 | 0.05 | 1.00 | 2.4 | — | 25 |
| | 3 | D-3 | 0.35 | 0.55 | 0.10 | 1.00 | 1.6 | — | 24 |
| | 4 | D-4 | 0.49 | 0.50 | 0.01 | 1.00 | 5.3 | — | 45 |
| | 5 | D-5 | 0.35 | 0.60 | 0.05 | 1.00 | 5.2 | — | 39 |
| | 6 | D-6 | 0.50 | 0.40 | 0.10 | 1.00 | 7.0 | — | 48 |
| | 7 | D-7 | 0.30 | 0.65 | 0.05 | 1.00 | 7.7 | — | 42 |
| | 8 | D-8 | 0.40 | 0.50 | 0.10 | 1.00 | 6.5 | — | 37 |

Example 16

The cutting tool bodies (inserts) used in Example 1 were placed in the vapor-deposition apparatus shown in FIGS. 2A and 2B, coated inserts 1-16 of the invention were produced by vapor-depositing the hard coating layer having the target composition and the target thickness shown in Table 24. In the above-described vapor deposition, as the cathode electrode (evaporation source) of the AIP device for forming the lower layer, Ti—Al—B alloy having a predetermined composition was used as an alternative to the Ti—Al alloy. The other vapor-deposition conditions were similar to those described in Example 10.

As a comparative example, the above-described cutting tool bodies (inserts) were placed in the deposition apparatus shown in FIG. 3. Conventional coated inserts 1-16 were produced by vapor-depositing the hard coating layer comprising (Ti, Al, B)N layer having the target composition and the target thickness shown in Table 25. In the above-described vapor deposition, as the cathode electrode (evaporation source) of the AIP device, Ti—Al—B alloy having a composition selected from various compositions was used as an alternative to the Ti—Al alloy. The other vapor-deposition conditions were similar to those described in Example 10.

Next, the above-described various coated inserts were respectively screw-mounted with a fixture-jig on an end of a cutting tool made of a tool steel. In that state, coated inserts of the invention 1-16, and conventional coated inserts 1-16 were applied to the following cutting tests.

Cutting tests on a Ni-based alloy were carried out under high-speed dry intermittent cutting conditions (cutting condition A) comprising:

workpiece: a round bar of Co-based alloy having a composition of Co-23% Cr-6% Mo-2% Ni-1% Fe-0.6% Si-0.4% C by mass %;

cutting speed: 55 m/min;

depth of cut: 1.3 mm;

feed: 0.1 mm/rev; and cutting time: 5 minutes.

Cutting tests on a Ti-based alloy were carried out under high-speed, dry, continuous cutting conditions (cutting condition B) comprising:

workpiece: a round bar of Ti-based alloy having a composition of Ti-6% Al-4% V;

cutting speed: 75 m/min;

depth of cut: 1.5 mm;

feed: 0.2 mm/rev; and cutting time: 5 minutes.

In addition, cutting tests on a Ni-based alloy were carried out under high-speed dry continuous cutting conditions (condition C) comprising:

workpiece: a round bar of Ni-based alloy having a composition of Ni-19% Cr-14% Co-4.5% Mo-2.5% Ti-2% Fe-1.2% Al-0.7% Mn-0.4% Si by mass %;

cutting speed: 60 m/min;

depth of cut: 0.8 mm;

feed: 0.15 mm/rev; and cutting time: 4 minutes.

In each of the cutting tests, widths of flank wear of the cutting edges were measured. The results are listed in Tables 24 and 25.

Table 24 and 25

TABLE 24

| Type | | SYMBOL OF CUTTING TOOL BODY | HARD COATING LAYER ||||| UPPER LAYER TARGET THICKNESS OF CrB$_2$ LAYER (μm) | Width of flank wear (mm) |||
| --- | --- | --- | --- | --- | --- | --- | --- | --- | --- | --- | --- |
| | | | LOWER LAYER ||||| | | | |
| | | | TARGET COMPOSITION (atomic ratio) |||| TARGET THICKNESS (μm) | | CUTTING CONDITION A | CUTTING CONDITION B | CUTTING CONDITION C |
| | | | Ti | Al | B | N | | | | | |
| COATED INSERT OF THE INVENTION | 1 | A-1 | 0.49 | 0.50 | 0.01 | 1.00 | 2.6 | 2.5 | 0.13 | 0.14 | 0.12 |
| | 2 | A-2 | 0.55 | 0.40 | 0.05 | 1.00 | 0.8 | 2.6 | 0.17 | 0.19 | 0.18 |
| | 3 | A-3 | 0.45 | 0.45 | 0.10 | 1.00 | 3.0 | 2.3 | 0.16 | 0.16 | 0.17 |
| | 4 | A-4 | 0.49 | 0.50 | 0.01 | 1.00 | 2.2 | 4.5 | 0.12 | 0.13 | 0.12 |
| | 5 | A-5 | 0.40 | 0.55 | 0.05 | 1.00 | 3.5 | 4.1 | 0.11 | 0.12 | 0.11 |
| | 6 | A-6 | 0.30 | 0.60 | 0.10 | 1.00 | 1.3 | 1.4 | 0.20 | 0.17 | 0.22 |
| | 7 | A-7 | 0.59 | 0.40 | 0.01 | 1.00 | 5.0 | 1.0 | 0.14 | 0.15 | 0.18 |
| | 8 | A-8 | 0.60 | 0.35 | 0.05 | 1.00 | 4.2 | 0.8 | 0.16 | 0.14 | 0.15 |
| | 9 | A-9 | 0.55 | 0.35 | 0.10 | 1.00 | 3.2 | 3.0 | 0.14 | 0.16 | 0.13 |
| | 10 | A-10 | 0.34 | 0.65 | 0.01 | 1.00 | 2.6 | 2.4 | 0.16 | 0.19 | 0.15 |
| | 11 | B-1 | 0.35 | 0.60 | 0.05 | 1.00 | 4.1 | 5.0 | 0.11 | 0.13 | 0.12 |
| | 12 | B-2 | 0.40 | 0.50 | 0.10 | 1.00 | 0.9 | 1.1 | 0.21 | 0.20 | 0.19 |
| | 13 | B-3 | 0.59 | 0.40 | 0.01 | 1.00 | 2.3 | 4.0 | 0.13 | 0.14 | 0.13 |
| | 14 | B-4 | 0.60 | 0.35 | 0.05 | 1.00 | 1.7 | 2.4 | 0.18 | 0.21 | 0.20 |
| | 15 | B-5 | 0.25 | 0.65 | 0.10 | 1.00 | 3.1 | 2.6 | 0.14 | 0.16 | 0.15 |
| | 16 | B-6 | 0.34 | 0.65 | 0.01 | 1.00 | 4.0 | 3.1 | 0.12 | 0.14 | 0.13 |

TABLE 25

| Type | | SYMBOL OF CUTTING TOOL BODY | HARD COATING LAYER ||||| Width of flank wear (mm) |||
| --- | --- | --- | --- | --- | --- | --- | --- | --- | --- | --- |
| | | | TARGET COMPOSITION (atomic ratio) |||| TARGET THICKNESS (μm) | CUTTING CONDITION A | CUTTING CONDITION B | CUTTING CONDITION C |
| | | | Ti | Al | B | N | | | | |
| CONVENTIONAL COATED INSERT | 1 | A-1 | 0.49 | 0.50 | 0.01 | 1.00 | 5.1 | 0.33 | 0.32 | 0.35 |
| | 2 | A-2 | 0.55 | 0.40 | 0.05 | 1.00 | 3.4 | 0.36 | 0.42 | 0.40 |
| | 3 | A-3 | 0.45 | 0.45 | 0.10 | 1.00 | 5.3 | 0.37 | 0.39 | 0.37 |
| | 4 | A-4 | 0.49 | 0.50 | 0.01 | 1.00 | 6.7 | 0.29 | 0.31 | 0.30 |
| | 5 | A-5 | 0.40 | 0.55 | 0.05 | 1.00 | 7.6 | 0.30 | 0.32 | 0.33 |
| | 6 | A-6 | 0.30 | 0.60 | 0.10 | 1.00 | 2.7 | 0.40 | 0.41 | 0.39 |
| | 7 | A-7 | 0.59 | 0.40 | 0.01 | 1.00 | 6.0 | 0.33 | 0.36 | 0.36 |
| | 8 | A-8 | 0.60 | 0.35 | 0.05 | 1.00 | 5.0 | 0.35 | 0.34 | 0.35 |
| | 9 | A-9 | 0.55 | 0.35 | 0.10 | 1.00 | 6.2 | 0.32 | 0.34 | 0.35 |
| | 10 | A-10 | 0.34 | 0.65 | 0.01 | 1.00 | 5.0 | 0.36 | 0.38 | 0.36 |
| | 11 | B-1 | 0.35 | 0.60 | 0.05 | 1.00 | 9.1 | 0.31 | 0.30 | 0.32 |
| | 12 | B-2 | 0.40 | 0.50 | 0.10 | 1.00 | 2.0 | 0.42 | 0.40 | 0.39 |
| | 13 | B-3 | 0.59 | 0.40 | 0.01 | 1.00 | 6.3 | 0.31 | 0.33 | 0.31 |
| | 14 | B-4 | 0.60 | 0.35 | 0.05 | 1.00 | 4.1 | 0.39 | 0.39 | 0.38 |
| | 15 | B-5 | 0.25 | 0.65 | 0.10 | 1.00 | 5.7 | 0.34 | 0.33 | 0.35 |
| | 16 | B-6 | 0.34 | 0.65 | 0.01 | 1.00 | 7.1 | 0.30 | 0.31 | 0.32 |

Example 17

The cutting tool bodies (end mills) used in Example 2 were placed in the vapor-deposition apparatus shown in FIGS. 2A and 2B. Using the same conditions as the above-described Example 16, coated end mills 1-8 of the invention were produced by vapor-depositing the hard coating layer having the target composition and the target thickness shown in Table 26.

As a comparative example, the above-described cutting tool bodies (end mills) were placed in the deposition apparatus shown in FIG. 3. Using the same conditions as the above-described Example 16, conventional coated end mills 1-8 were produced by vapor-depositing the hard coating layer comprising (Ti, Al, B)N layer having the target composition and the target thickness shown in Table 26.

Next, the above-described coated end mills 1 to 8 of the invention, and conventional coated end mills 1 to 8 were applied to the cutting tests.

The coated end mills 1 to 3 of the invention, and comparative coated end mills 1 to 3 were applied to high-speed dry slotting of a Co-based alloy under conditions comprising:

workpiece: a plate of a Co-based alloy having a plate dimension of 100 mm×250 mm and a thickness of 50 mm, and having a composition of Co-20% Cr-20% Ni-4% Mo-4% W-4% Cd-3% Fe-1.5% Mn-0.7% Si-0.38% C by mass percent;
   cutting speed: 45 m/min;
   depth of slot (depth of cut): 2 mm; and
   table feed: 250 mm/min.

The coated end mills 4 to 6 of the invention, and comparative coated end mills 4 to 6 were applied to high-speed dry slotting of a Ni-based alloy under conditions comprising:
   workpiece: a plate of a Ni-based alloy having a plate dimension of 100 mm×250 mm and a thickness of 50 mm, and having a composition of Ni-19% Cr-18.5% Fe-5.2% Cd-5% Ta-3% Mo-0.9% Ti-0.5% Al-0.3% Mn-0.05% Cu-0.04% C by mass %;
   cutting speed: 60 m/min;
   depth of slot (depth of cut): 4 mm; and
   table feed: 280 mm/min.

The coated end mills 7 and 8 of the invention, and comparative coated end mills 7 and 8 were applied to high-speed dry slotting of a Ti-based alloy under conditions comprising:
   workpiece: a plate of Ti-based alloy having a plate dimension of 100 mm×250 mm and a thickness of 50 mm, and having a composition of Ti-3% Al-2.5% V by mass %;
   cutting speed: 50 m/min;
   depth of slot (depth of cut): 7 mm; and
   table feed: 160 mm/min.

In each of the slotting tests, the length of the cut slot by the end mill until the end of its tool life was measured, where the end mill was regarded to reach the end of its tool life when a width of flank wear of a peripheral edge of a cutting edge of the end mill reached 0.1 mm. The results are respectively listed in Table 26.

Example 16, coated drills 1-8 of the invention were produced by vapor-depositing the hard coating layer having the target composition and the target thickness shown in Table 27.

As a comparative example, the above-described cutting tool bodies (drills) were placed in the deposition apparatus shown in FIG. 3. Using the same conditions as the above-described Example 16, conventional coated drills 1-8 were produced by vapor-depositing the hard coating layer comprising (Ti, Al, B)N layer having the target composition and the target thickness shown in Table 27.

Next, the above-described coated drills 1 to 8 of the invention, and conventional coated drills 1 to 8 were applied to the drilling tests.

The coated drills 1 to 3 of the invention, and conventional coated drills 1 to 3 were applied to high-speed wet drilling tests of Ti-based alloy under conditions comprising:
   workpiece: a plate of a Ti-based alloy having a plate dimension of 100 mm×250 mm and a thickness of 50 mm, and having a composition of Ti-3% Al-2.5% V by mass %;
   cutting speed: 45 m/min;
   feed: 0.25 mm/rev; and
   depth of a hole: 7 mm.

The coated drills 4 to 6 of the invention, and conventional coated drills 4 to 6 were applied to high-speed wet drilling tests of a Co-based alloy under conditions comprising:
   workpiece: a plate of a Co-based alloy having a plate dimension of 100 mm×250 mm and a thickness of 50 mm, and a composition of Co-20% Cr-15% W-10% Ni-1.5% Mn-1% Si-1% Fe-0.12% C by mass %;
   cutting speed: 50 m/min;
   feed: 0.1 mm/rev; and
   depth of a hole: 16 mm.

TABLE 26

| | | | HARD COATING LAYER | | | | | |
| --- | --- | --- | --- | --- | --- | --- | --- | --- |
| | | SYMBOL OF CUTTING TOOL | LOWER LAYER | | | | UPPER LAYER TARGET THICKNESS OF $CrB_2$ LAYER | LENGTH OF CUT SLOT |
| | | | TARGET COMPOSITION (atomic ratio) | | | | TARGET THICKNESS | |
| Type | | BODY | Ti | Al | B | N | (μm) | (μm) | (m) |
| COATED END MILL OF THE INVENTION | 1 | C-1 | 0.25 | 0.65 | 0.10 | 1.00 | 0.8 | 1.2 | 35 |
| | 2 | C-2 | 0.50 | 0.45 | 0.05 | 1.00 | 1.2 | 2.1 | 36 |
| | 3 | C-3 | 0.39 | 0.60 | 0.01 | 1.00 | 2.6 | 0.8 | 40 |
| | 4 | C-4 | 0.35 | 0.55 | 0.10 | 1.00 | 4.0 | 2.5 | 42 |
| | 5 | C-5 | 0.60 | 0.35 | 0.05 | 1.00 | 2.0 | 1.7 | 34 |
| | 6 | C-6 | 0.50 | 0.40 | 0.10 | 1.00 | 1.8 | 5.0 | 46 |
| | 7 | C-7 | 0.55 | 0.35 | 0.10 | 1.00 | 3.3 | 2.7 | 35 |
| | 8 | C-8 | 0.34 | 0.65 | 0.01 | 1.00 | 5.0 | 3.0 | 38 |
| CONVENTIONAL COATED END MILL | 1 | C-1 | 0.25 | 0.65 | 0.10 | 1.00 | 2.0 | — | 8 |
| | 2 | C-2 | 0.50 | 0.45 | 0.05 | 1.00 | 3.3 | — | 12 |
| | 3 | C-3 | 0.39 | 0.60 | 0.01 | 1.00 | 3.4 | — | 15 |
| | 4 | C-4 | 0.35 | 0.55 | 0.10 | 1.00 | 6.5 | — | 12 |
| | 5 | C-5 | 0.60 | 0.35 | 0.05 | 1.00 | 3.7 | — | 11 |
| | 6 | C-6 | 0.50 | 0.40 | 0.10 | 1.00 | 6.8 | — | 18 |
| | 7 | C-7 | 0.55 | 0.35 | 0.10 | 1.00 | 6.0 | — | 10 |
| | 8 | C-8 | 0.34 | 0.65 | 0.01 | 1.00 | 8.0 | — | 14 |

Example 18

The cutting tool bodies (drills) used in Example 3 were placed in the vapor-deposition apparatus shown in FIGS. 2A and 2B. Using the same conditions as the above-described The coated drills 7 and 8 of the invention, and conventional coated drills 7 and 8 were applied to high-speed wet drilling tests of a Ni-based alloy under conditions comprising:
   workpiece: a plate of a Ni-based alloy having a plate dimension of 100 mm×250 mm and a thickness of 50 mm, and a composition of Ni-19% Cr-14% Co-4.5% Mo-2.5% Ti-2% Fe-1.2% Al-0.7% Mn-0.4% Si by mass %;

cutting speed: 55 m/min;
feed: 0.3 mm/rev; and
depth of a hole: 30 mm.

In each test of the high-speed wet drilling (using a water-soluble cutting fluid), the numbers of holes drilled until the time when the width of flank wear of the cutting edge of the end of the drill reached 0.3 mm were counted. The results are listed in Table 27.

TABLE 27

| Type | | SYMBOL OF CUTTING TOOL BODY | LOWER LAYER TARGET COMPOSITION (atomic ratio) | | | | LOWER LAYER TARGET THICKNESS (μm) | UPPER LAYER TARGET THICKNESS OF $CrB_2$ LAYER (μm) | NUMBER OF DRILLING (holes) |
|---|---|---|---|---|---|---|---|---|---|
| | | | Ti | Al | B | N | | | |
| COATED DRILL OF THE INVENTION | 1 | D-1 | 0.59 | 0.40 | 0.01 | 1.00 | 0.8 | 1.0 | 75 |
| | 2 | D-2 | 0.50 | 0.45 | 0.05 | 1.00 | 1.7 | 1.2 | 87 |
| | 3 | D-3 | 0.35 | 0.55 | 0.10 | 1.00 | 3.4 | 2.0 | 92 |
| | 4 | D-4 | 0.49 | 0.50 | 0.01 | 1.00 | 4.1 | 3.0 | 120 |
| | 5 | D-5 | 0.35 | 0.60 | 0.05 | 1.00 | 2.9 | 0.8 | 72 |
| | 6 | D-6 | 0.50 | 0.40 | 0.10 | 1.00 | 3.1 | 2.5 | 90 |
| | 7 | D-7 | 0.30 | 0.65 | 0.05 | 1.00 | 5.0 | 4.1 | 110 |
| | 8 | D-8 | 0.40 | 0.50 | 0.10 | 1.00 | 3.5 | 5.0 | 98 |
| CONVENTIONAL COATED DRILL | 1 | D-1 | 0.59 | 0.40 | 0.01 | 1.00 | 1.8 | — | 22 |
| | 2 | D-2 | 0.50 | 0.45 | 0.05 | 1.00 | 2.9 | — | 26 |
| | 3 | D-3 | 0.35 | 0.55 | 0.10 | 1.00 | 5.4 | — | 42 |
| | 4 | D-4 | 0.49 | 0.50 | 0.01 | 1.00 | 7.1 | — | 40 |
| | 5 | D-5 | 0.35 | 0.60 | 0.05 | 1.00 | 3.7 | — | 27 |
| | 6 | D-6 | 0.50 | 0.40 | 0.10 | 1.00 | 5.5 | — | 30 |
| | 7 | D-7 | 0.30 | 0.65 | 0.05 | 1.00 | 9.1 | — | 53 |
| | 8 | D-8 | 0.30 | 0.50 | 0.10 | 1.00 | 8.5 | — | 46 |

From the products of the above-described examples, compositions of the (Ti, Al, Si)N layers and (Ti, Al, B)N layers (lower layers) constituting the hard coating layers of the coated inserts of the invention, coated end mills of the invention, coated drills of the invention, as the surface-coated cutting tools of the invention and compositions of (Ti, Al, Si)N layers and (Ti, Al, B)N layers constituting the hard coating layers of the conventional coated inserts, conventional coated end mills, and conventional coated drills as the conventional coated cutting tools were analyzed by energy dispersive X-ray analysis using a transmission electron microscope. As a result, each of the above-described layers showed substantially the same composition as its target composition.

In addition, average thickness of each of the above-described constituent layers of the hard coating layers was measured based on the measurement of the section of the layer using a scanning electron microscope. As a result, each of the layers showed the average value (average of the thickness of 5 positions) that was substantially the same value as the target thickness.

The results shown in Table 3 through Table 27 clearly indicate a difference between the surface-coated cutting tools of the invention and conventional surface-coated cutting tools during the high-speed cutting of hard difficult-to-cut materials, such as Ti-based alloy, Ni-based alloy, Co-based alloy, high-Si Al—Si system alloy. In the surface-coated cutting tool of the invention, the lower layer as a constituent of the hard coating layer comprises the (Ti,Al)N layer, (Ti, Al, Si)N layer, or the (Ti, Al, B)N layer and exhibits excellent high temperature hardness, heat resistance, and excellent high temperature strength. In addition, the $CrB_2$ layer as the upper layer ensures excellent thermal stability (extremely low reactivity) against the work material comprising difficult-to-cut materials. Therefore, the surface-coated cutting tools of the invention shows excellent wear resistance for a long period of time, even in the case of high-speed cutting of the hard difficult-to-cut material accompanied with high heat generation. On the other hand, in the conventional surface-coated cutting tools having a hard coating layer consists of the (Ti, Al)N layer, the (Ti, Al, Si)N layer, or the (Ti, Al, B)N layer, each respectively shows rapid progress of wear during the high-speed cutting of the above-described hard difficult-to-cut material, reaching the ends of tool lives within a relatively short period of time.

In addition, tight bonding of the $CrB_2$ layer by the bonding layer comprising the CrN layer or the composite boronitride layer containing Ti, Al, and Cr, further ensure excellent thermal stability (extremely low reactivity) against the work material comprising difficult-to-cut materials. Therefore, surface-coated cutting tools of the invention can realize excellent wear resistance over a long period of time without interlayer exfoliation occurring.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

As described above, since surface-coated cutting tools according to the invention can exhibit excellent wear resistance, as well as in cutting of various steels and cast irons in normal cutting conditions, even in high-speed cutting of hard difficult-to-cut materials accompanied with high-heat generation, the surface-coated cutting tools can sufficiently satisfactorily be applied to increase performance and automation of cutting machines, and power saving, energy saving, and cost reduction of the cutting operation.

The invention claimed is:

1. A surface-coated cutting tool comprising:
   a cutting tool body; and
   a hard coating layer formed on a surface of the cutting tool body, wherein
   the hard coating layer comprises a lower layer comprising a composite nitride containing Ti and Al, and an upper layer comprising chromium boride,
   wherein the lower layer is formed such that a part of the Al is substituted by Si, and the lower layer satisfies a composition formula: $(Ti_{1-X}Al_{X-Y}Si_Y)N$, where X is in a range from 0.40 to 0.75 and Y is 0.10 or less.

2. The surface-coated cutting tool according to claim 1, wherein a bonding layer comprising chromium nitride is provided between the upper layer and the lower layer.

3. The surface-coated cutting tool according to claim 2, wherein the bonding layer has an average thickness of 0.1 to 0.5 μm.

4. The surface-coated cutting tool according to claim 1, wherein a bonding layer comprising composite boronitride containing Ti, Al and Cr is provided between the upper layer and the lower layer.

5. The surface-coated cutting tool according to claim 4, wherein the bonding layer has an average thickness of 0.1 to 0.5 μm.

6. The surface-coated cutting tool according to claim 1, wherein the lower layer has an average thickness of 0.8 to 5 μm.

7. The surface-coated cutting tool according to claim 1, wherein the upper layer has an average thickness of 0.8 to 5 μm.

8. The surface-coated cutting tool according to claim 1, wherein the cutting tool body is made of tungsten carbide-based hardmetal.

9. The surface-coated cutting tool according to claim 1, wherein the cutting tool body is made of titanium carbide-based cermet.

10. The surface-coated cutting tool comprising:
    a cutting tool body; and
    a hard coating layer formed on a surface of the cutting tool body, wherein
    the hard coating layer comprises a lower layer comprising a composite nitride containing Ti and Al, and an upper layer comprising chromium boride, wherein the lower layer is formed such that a part of the Al is substituted by B, and
    the lower layer satisfies a composition formula: $(Ti_{1-X}Al_{X-Z}B_Z)N$, where X is in a range from 0.40 to 0.75 and Z is 0.10 or less.

11. The surface-coated cutting tool according to claim 10, wherein a bonding layer comprising chromium nitride is provided between the upper layer and the lower layer.

12. The surface-coated cutting tool according to claim 11, wherein the bonding layer has an average thickness of 0.1 to 0.5 μm.

13. The surface-coated cutting tool according to claim 10, wherein a bonding layer comprising composite boronitride containing Ti, Al and Cr is provided between the upper layer and the lower layer.

14. The surface-coated cutting tool according to claim 13, wherein the bonding layer has an average thickness of 0.1 to 0.5 μm.

15. The surface-coated cutting tool according to claim 10, wherein the lower layer has an average thickness of 0.8 to 5 μm.

16. The surface-coated cutting tool according to claim 10, wherein the upper layer has an average thickness of 0.8 to 5 μm.

17. The surface-coated cutting tool according to claim 10, wherein the cutting tool body is made of tungsten carbide-based hardmetal.

18. The surface-coated cutting tool according to claim 10, wherein the cutting tool body is made of titanium carbide-based cermet.

* * * * *